(12) United States Patent
Bartley et al.

(10) Patent No.: US 8,108,647 B2
(45) Date of Patent: Jan. 31, 2012

(54) DIGITAL DATA ARCHITECTURE EMPLOYING REDUNDANT LINKS IN A DAISY CHAIN OF COMPONENT MODULES

(75) Inventors: Gerald Keith Bartley, Rochester, MN (US); Darryl John Becker, Rochester, MN (US); John Michael Borkenhagen, Rochester, MN (US); Philip Raymond Germann, Oronoco, MN (US); William Paul Hovis, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 551 days.

(21) Appl. No.: 12/361,666

(22) Filed: Jan. 29, 2009

(65) Prior Publication Data

US 2010/0191894 A1    Jul. 29, 2010

(51) Int. Cl.
*G06F 12/16* (2006.01)
*G06F 11/00* (2006.01)

(52) U.S. Cl. ............... 711/170; 711/5; 714/25; 714/27; 714/40; 714/42; 714/43

(58) Field of Classification Search ............ 711/5, 170; 714/25, 27, 40, 42, 43
See application file for complete search history.

(56) References Cited

U.S. PATENT DOCUMENTS

| | | | |
|---|---|---|---|
| 5,005,158 A * | 4/1991 | McClure et al. ............ | 365/200 |
| 7,340,658 B2 * | 3/2008 | Seuring ..................... | 714/726 |
| 7,342,816 B2 | 3/2008 | Bartley et al. | |
| 7,345,900 B2 | 3/2008 | Bartley et al. | |
| 7,345,901 B2 | 3/2008 | Bartley et al. | |
| 7,788,573 B2 * | 8/2010 | Yamanaka .................. | 714/799 |
| 2007/0089035 A1 * | 4/2007 | Alexander et al. ........... | 714/766 |
| 2008/0028123 A1 | 1/2008 | Bartley et al. | |
| 2008/0028125 A1 | 1/2008 | Bartley et al. | |
| 2008/0028126 A1 | 1/2008 | Bartley et al. | |
| 2008/0028158 A1 | 1/2008 | Bartley et al. | |
| 2008/0028159 A1 | 1/2008 | Bartley et al. | |
| 2008/0028160 A1 | 1/2008 | Bartley et al. | |
| 2008/0028161 A1 | 1/2008 | Bartley et al. | |
| 2008/0028175 A1 | 1/2008 | Bartley et al. | |
| 2008/0028177 A1 | 1/2008 | Bartley et al. | |
| 2008/0040529 A1 | 2/2008 | Bartley et al. | |

OTHER PUBLICATIONS

Gerald K Bartley et al., U.S. Appl. No. 11/829,250, "Spider Web Interconnect Topology Utilizing Multiple Port Connector", filed Jul. 27, 2007.

\* cited by examiner

*Primary Examiner* — John Lane
(74) *Attorney, Agent, or Firm* — Roy W. Truelson

(57) ABSTRACT

A communications architecture utilizes modules arranged in a daisy-chain, each module supporting multiple input and output ports. Point-to-point links are arranged so that a first output link of each of multiple modules connects to the next module in the chain, and a second output link connects to a module after it, and inputs arranged similarly, so that any single module can be by-passed in the event of malfunction. Multiple chains may be cross-linked and/or serviced by hubs or chains of hubs. Preferably, the redundant links are used in a non-degraded operating mode to provide higher bandwidth and/or reduced latency of communication. The exemplary embodiment is a memory subsystem in which the modules are buffered memory chips.

20 Claims, 11 Drawing Sheets

DIGITAL DATA ARCHITECTURE EMPLOYING REDUNDANT LINKS IN A DAISY CHAIN OF COMPONENT MODULES

FIELD OF THE INVENTION

The present invention relates to digital data processing hardware, and in particular to the design and operation of daisy-chained modules in a digital data processing system.

BACKGROUND OF THE INVENTION

In the latter half of the twentieth century, there began a phenomenon known as the information revolution. While the information revolution is a historical development broader in scope than any one event or machine, no single device has come to represent the information revolution more than the digital electronic computer. The development of computer systems has surely been a revolution. Each year, computer systems grow faster, store more data, and provide more applications to their users.

A modern computer system typically comprises one or more central processing units (CPUs) and supporting hardware necessary to store, retrieve and transfer information, such as communications buses and memory. It also includes hardware necessary to communicate with the outside world, such as input/output controllers or storage controllers, and devices attached thereto such as keyboards, monitors, tape drives, disk drives, communication lines coupled to a network, etc. The CPU is the heart of the system. It executes the instructions which comprise a computer program and directs the operation of the other system components.

From the standpoint of the computer's hardware, most systems operate in fundamentally the same manner. Processors are capable of performing a limited set of very simple operations, such as arithmetic, logical comparisons, and movement of data from one location to another. But each operation is performed very quickly. Programs which direct a computer to perform massive numbers of these simple operations give the illusion that the computer is doing something sophisticated. What is perceived by the user as a new or improved capability of a computer system is made possible by performing essentially the same set of very simple operations, but doing it much faster. Therefore continuing improvements to computer systems require that these systems be made ever faster.

A computer's CPU operates on data stored in the computer's addressable main memory. The memory stores both the instructions which execute in the processor, and the data which is manipulated by those instructions. In operation, the processor is constantly accessing instructions and other data in memory, without which it is unable to perform useful work. The design of the memory subsystem and speed at which it operates are critical issues in the overall performance of any computer system.

Memory is typically embodied in a set of integrated circuit modules. The time required to access memory is not only a function of the operational speed of the memory modules themselves, but of the speed of the path between the processor and memory. As computers have grown more complex, this path has consumed a larger share of the access time. Early computers had but a single processor and a relatively small memory, making the path between processor and memory relatively direct. Large modern systems typically contain multiple processors, multiple levels of cache, complex addressing mechanisms, and very large main memories to support the data requirements of the system. In these systems, it is simply not possible for direct paths to exist from every processor to every memory module. Complex bus structures support the movement of data among various system components. Often, data must traverse several structures between the processor and the actual memory module. This complexity not only affects access time, but the reliability of the memory subsystem as well. As the number of processors and size of memory grows, these issues become more acute.

Recently, there has been some interest in a memory architecture in which multiple buffered memory modules are configured in a daisy-chained arrangement. A command is passed from one module in the chain to the next, until it reaches its intended destination, and if data is to be returned, the returned data is passed back up the chain. Each link of the chain is a point-to-point link, typically comprising a pair of point-to-point unidirectional serial buses transmitting in opposite directions, each unidirectional serial bus going from a single module as sender to a single module as receiver. As used herein, a serial bus may have one, or more typically multiple, data lines, but requires multiple strobes of a bus clock ("bus beats") to complete a single transaction. The data is divided at the sender and re-assembled at the receiver. A link could alternatively be a parallel bus, in which a single bus beat is required to complete the bus transaction.

The use of unidirectional point-to-point links has certain advantages in terms of bus clock speed and simplicity, since it does not require arbitration. However, there are certain limitations to this arrangement. The time to access a memory module increases in accordance with its position in the daisy chain, which places practical limitations on the length of the daisy chain. Additionally, a daisy chain arrangement may have a greater reliability exposure than, for example, a multi-drop bus, since a malfunction of a memory chip at the head of the daisy chain could effectively block access to all chips further down the chain.

A need exists for computer communications architectures having greater reliability and efficiency, and in particular for memory subsystem architectures supporting multiple memory modules having greater reliability and efficiency.

SUMMARY OF THE INVENTION

A computer system communications architecture utilizes multiple modules arranged in at least one daisy-chain of modules, in which each module supports multiple input ports and multiple output ports. The links are arranged so that a first output link of each of multiple modules connects to the next module in the chain, and a second output link connects to a module after it, and inputs arranged similarly, thus forming multiple paths down the chain. The links are arranged so that any single module can be by-passed in the event of malfunction.

In a preferred embodiment, a module N in a chain is coupled by a first output to a module (N+1) and by a second output to a module (N+2), and is likewise coupled by a first input to a module (N−1) and a second input to a module (N−2). In one variation of this embodiment, both the first and second modules of the chain are coupled by their first and second inputs respectively to a module at the head of the bus, such as a controller or repeater, the second input of the first module being unused. In a second variation of this embodiment, two chains are cross-linked by coupling outputs of the end modules to inputs of modules at the beginning of the other chain. It will be understood that other variations are possible.

In the preferred embodiment, the redundant paths or links are used in a non-degraded operating mode to provide higher bandwidth and/or reduced latency of data communications in the daisy chain. Failure of a single module or link in the daisy chain may reduce bandwidth and/or increase latency, but the data connection will still be maintained.

In the preferred embodiment, the modules are memory chip modules of a memory subsystem, each module containing a plurality of addressable memory locations, it being understood that it would be possible to apply the architectural principles described herein to other functional modules arranged in a daisy chain.

By configuring modules, and particularly memory chip modules, in daisy chains having multiple redundant paths as disclosed herein, access to the downstream modules in a daisy chain is maintained notwithstanding the failure of any single module in the chain. Furthermore, in the absence of a module failure, the redundant paths can be used to increase the efficiency of access, either by reducing latency time to reach a module far down the chain, or by reducing the average traffic on each link in the chain.

The details of the present invention, both as to its structure and operation, can best be understood in reference to the accompanying drawings, in which like reference numerals refer to like parts, and in which:

DETAILED DESCRIPTION OF THE PREFERRED EMBODIMENTS

Future Memory Chip Overview

Figure 1:
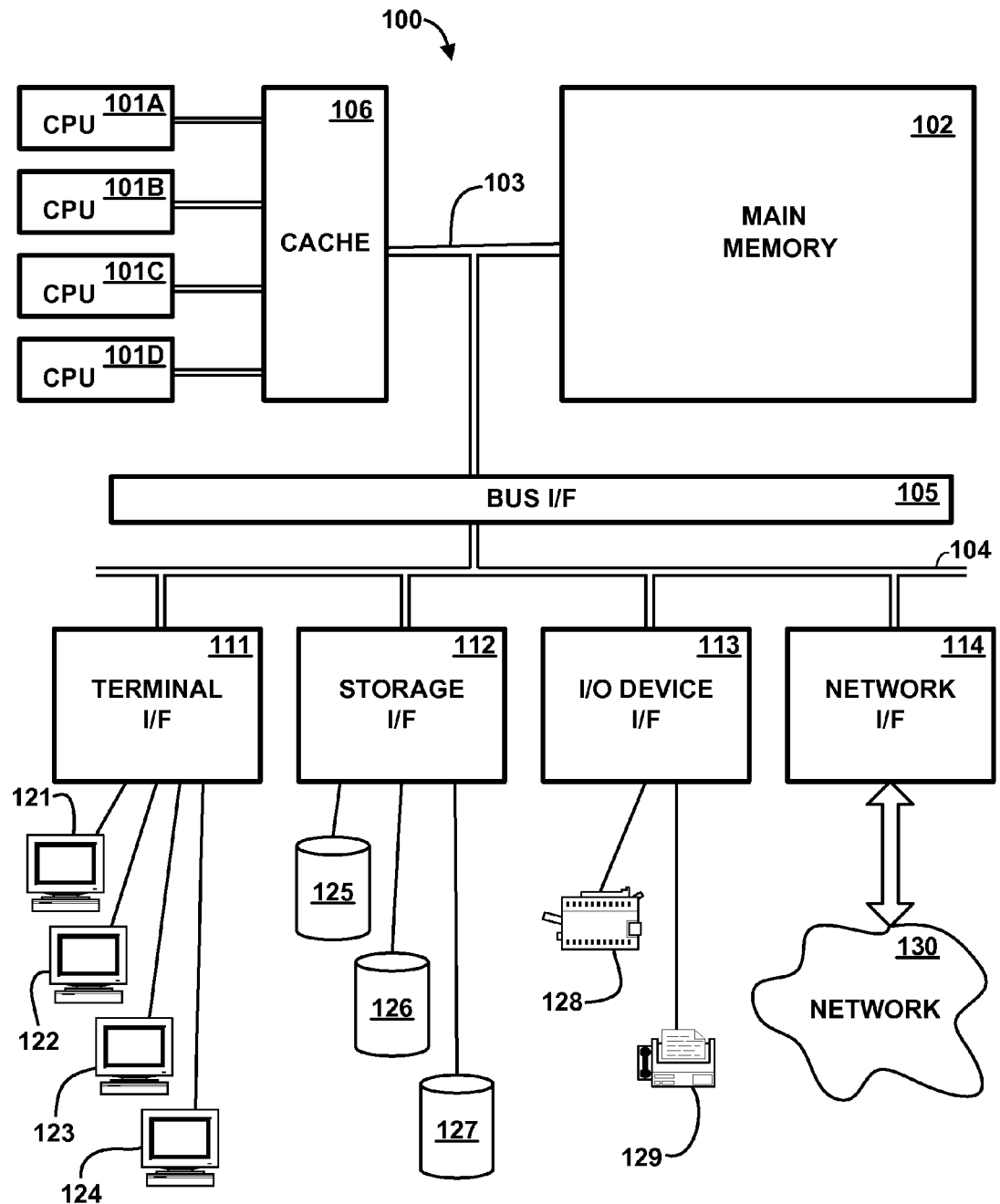
FIG. 1 is a high-level block diagram of the major hardware components of a computer system utilizing a memory subsystem having buffered memory chip modules, according to the preferred embodiment of the present invention.

The present inventors envision a buffered memory chip module and memory chip architecture supporting chains of memory chips. Such an architecture is described in the following U.S. patents and commonly assigned copending patent applications, each of which is herein incorporated by reference: U.S. Pat. No. 7,345,900 to Bartley et al., issued Mar. 18, 2008; U.S. application Ser. No. 11/459,957, filed Jul. 26, 2006, entitled "Memory System Having Self Timed Daisy Chained Memory Chips"; U.S. application Ser. No. 11/459,969, filed Jul. 26, 2006, entitled "Carrier Having Daisy Chained Memory Chips"; U.S. application Ser. No. 11/459,983, filed Jul. 26, 2006, entitled "Carrier Having Daisy Chain of Self Timed Memory Chips"; U.S. Pat. No. 7,342,816 to Bartley et al., issued Mar. 11, 2008; U.S. application Ser. No. 11/459,997, filed Jul. 26, 2006, entitled "Daisy Chainable Self Timed Memory Chip"; U.S. application Ser. No. 11/459,974, filed Jul. 26, 2006, entitled "Computer System Having Daisy Chained Memory Chips"; U.S. Pat. No. 7,345,901 to Bartley et al., issued Mar. 18, 2008; U.S. application Ser. No. 11/459,966, filed Jul. 26, 2006, entitled "Memory Controller for Daisy Chained Memory Chips"; U.S. application Ser. No. 11/459,961, filed Jul. 26, 2006, entitled "Memory Controller for Daisy Chained Self Timed Memory Chips"; U.S. application Ser. No. 11/459,943, filed Jul. 26, 2006, entitled "Memory Chip Having an Apportionable Data Bus"; U.S. application Ser. No. 11/459,947, filed Jul. 26, 2006, entitled "Self Timed Memory Chip Having an Apportionable Data Bus"; U.S. application Ser. No. 11/459,955, filed Jul. 26, 2006, entitled "Computer System Having an Apportionable Data Bus"; and U.S. application Ser. No. 11/459,959, filed Jul. 26, 2006, entitled "Memory System Having an Apportionable Data Bus and Daisy Chained Memory Chips".

As described therein, a buffered memory chip module is designed for use in a daisy chained configuration. The memory chip has dual sets of high-frequency communications interfaces. These are intended for connection to other memory chips or a memory controller via respective point-to-point communications links (buses). One point-to-point link connects the chip with the next upstream device on the daisy chain, which could be another chip or could be the memory controller. The other point-to-point link connects the chip with the next downstream memory chip, if there is one. Daisy-chaining of point-to-point links eliminates the need for conventional buffer chips between the memory controller and the memory chips, assures that all links will be point-to-point, and therefore facilitates bus operation at a higher frequency.

Although each link has multiple data lines, the links operate in a serial manner in the sense that multiple bus cycles are required to transmit a single command or data word. Buffers in each chip temporarily store portions of data words and commands as these are transmitted over the bus.

The daisy-chain design places no restriction on the internal memory technology used for storing data within the memory chips. It is expected that dynamic random access memory (DRAM) will be most generally used, although static RAM is also possible. Furthermore, any future improvements to memory storage technologies, or new technologies altogether, can generally be accommodated within the basic framework of the buffered memory chip configuration described herein.

In accordance with the preferred embodiments described herein, any of various exemplary daisy chained chip designs described in the above identified patent applications is modified at least to provide multiple input ports and multiple output ports for each chip, and control logic for managing data transmission using the multiple ports.

DETAILED DESCRIPTION

Referring to the Drawing, wherein like numbers denote like parts throughout the several views, FIG. 1 is a high-level representation of the major hardware components of a computer system 100 having a memory subsystem utilizing buffered memory chips, according to the preferred embodiment. The major components of computer system 100 include one or more central processing units (CPU) 101A-101D, main memory subsystem 102, cache memory 106, terminal interface 111, storage interface 112, I/O device interface 113, and communications/network interfaces 114, all of which are coupled for inter-component communication via buses 103, 104 and bus interface 105.

System 100 contains one or more general-purpose programmable central processing units (CPUs) 101A-101D, herein generically referred to as feature 101. In the embodiment represented in FIG. 1, system 100 contains multiple processors typical of a relatively large system; however, system 100 could alternatively be a single CPU system. Each processor 101 executes instruction stored in memory 102. Instructions and other data are loaded into cache memory 106 from main memory 102 for processing. Main memory 102 is a random-access semiconductor memory for storing data, including programs. Although main memory 102 and cache 106 are represented conceptually in FIG. 1 as single entities, it will be understood that in fact these are more complex, and that cache may exist at multiple different levels, as is known in the art. In particular, main memory subsystem 102 comprises multiple modules and communications components, as described more fully herein.

Buses 103-105 provide communication paths among the various system components. Processor/memory bus 103 (herein referred to as front-side bus) provides a data communication path for transferring data among CPUs 101 and caches 106, main memory 102 and I/O bus interface unit 105. I/O bus interface 105 is further coupled to system I/O bus 104 for transferring data to and from various I/O units. I/O bus interface 105 communicates with multiple I/O interface units 111-114, which are also known as I/O processors (IOPs) or I/O adapters (IOAs), through system I/O bus 104. System I/O bus may be, e.g., an industry standard PCI bus, or any other appropriate bus technology.

I/O interface units 111-114 support communication with a variety of storage and I/O devices. For example, terminal interface unit 111 supports the attachment of one or more user terminals 121-124. Storage interface unit 112 supports the attachment of one or more direct access storage devices (DASD) 125-127 (which are typically rotating magnetic disk drive storage devices, although they could alternatively be other devices, including arrays of disk drives configured to appear as a single large storage device to a host). I/O and other device interface 113 provides an interface to any of various other input/output devices or devices of other types. Two such devices, printer 128 and fax machine 129, are shown in the exemplary embodiment of FIG. 1, it being understood that many other such devices may exist, which may be of differing types. Network interface 114 provides one or more communications paths from system 100 to other digital devices and computer systems; such paths may include, e.g., one or more networks 130 such as the Internet, local area networks, or other networks, or may include remote device communication lines, wireless connections, and so forth.

It should be understood that FIG. 1 is intended to depict the representative major components of system 100 at a high level, that individual components may have greater complexity than represented in FIG. 1, that components other than or in addition to those shown in FIG. 1 may be present, and that the number, type and configuration of such components may vary. It will further be understood that not all components shown in FIG. 1 may be present in a particular computer system. Several particular examples of such additional complexity or additional variations are disclosed herein, it being understood that these are by way of example only and are not necessarily the only such variations.

Although front-side bus 103 is shown in FIG. 1 as a relatively simple, single bus structure providing a direct communication path among cache 106, main memory 102 and I/O bus interface 105, in fact front-side bus 103 may comprise multiple different buses or communication paths, which may be arranged in any of various forms, such as point-to-point links in hierarchical, star or web configurations, multiple hierarchical buses, parallel and redundant paths, etc. Furthermore, while I/O bus interface 105 and I/O bus 104 are shown as single respective units, system 100 may in fact contain multiple I/O bus interface units 105 and/or multiple I/O buses 104. While multiple I/O interface units are shown which separate a system I/O bus 104 from various communications paths running to the various I/O devices, it would alternatively be possible to connect some or all of the I/O devices directly to one or more system I/O buses.

Main memory 102 is shown in FIG. 1 as a single monolithic entity, but it will be understood that main memory may have a more complex structure. For example, main memory may be distributed and associated with different CPUs or sets of CPUs, as is known in any of various so-called non-uniform memory access (NUMA) computer architectures, or may be divided into discrete subsets for access by separate buses which collectively comprise front-side bus 103, or may form some other architecture. Similarly, although cache is shown as a single entity, there may be multiple hierarchical levels of caches, some of which may be shared by all or some of CPUs 101A-101D, and some of which may be dedicated for use of single respective CPUs. Furthermore, caches may be divided by function, so that one cache holds instructions while another holds non-instruction data which is used by the processor or processors. As used herein, a "memory subsystem" is a memory or a cache or any portion thereof. A memory subsystem may encompass all of main memory 102, or a portion of main memory 102, or all or a portion of a cache memory 106. It is specifically preferred that a memory subsystem be all or a part of main memory 102, since cache generally requires faster access, although the present invention is not limited to use in main memory and may be adaptable to some cache memory as well. Furthermore, although the present invention is described in the preferred embodiment as a redundant daisy chain of memory chip modules, is could be implemented as a redundant daisy chain of functional modules other than memory modules.

Computer system 100 depicted in FIG. 1 has multiple attached terminals 121-124, such as might be typical of a multi-user "mainframe" computer system. Typically, in such a case the actual number of attached devices is greater than those shown in FIG. 1. Although FIG. 1 represents a typical multi-user system, the present invention is not limited to systems of any particular size. Computer system 100 may alternatively be a single-user system, typically containing only a single user display and keyboard input, or might be a server or similar device which has little or no direct user interface, but receives requests from other computer systems (clients).

While various system components have been described and shown at a high level, it should be understood that a typical computer system contains many other components not shown, which are not essential to an understanding of the present invention.

Figure 2:
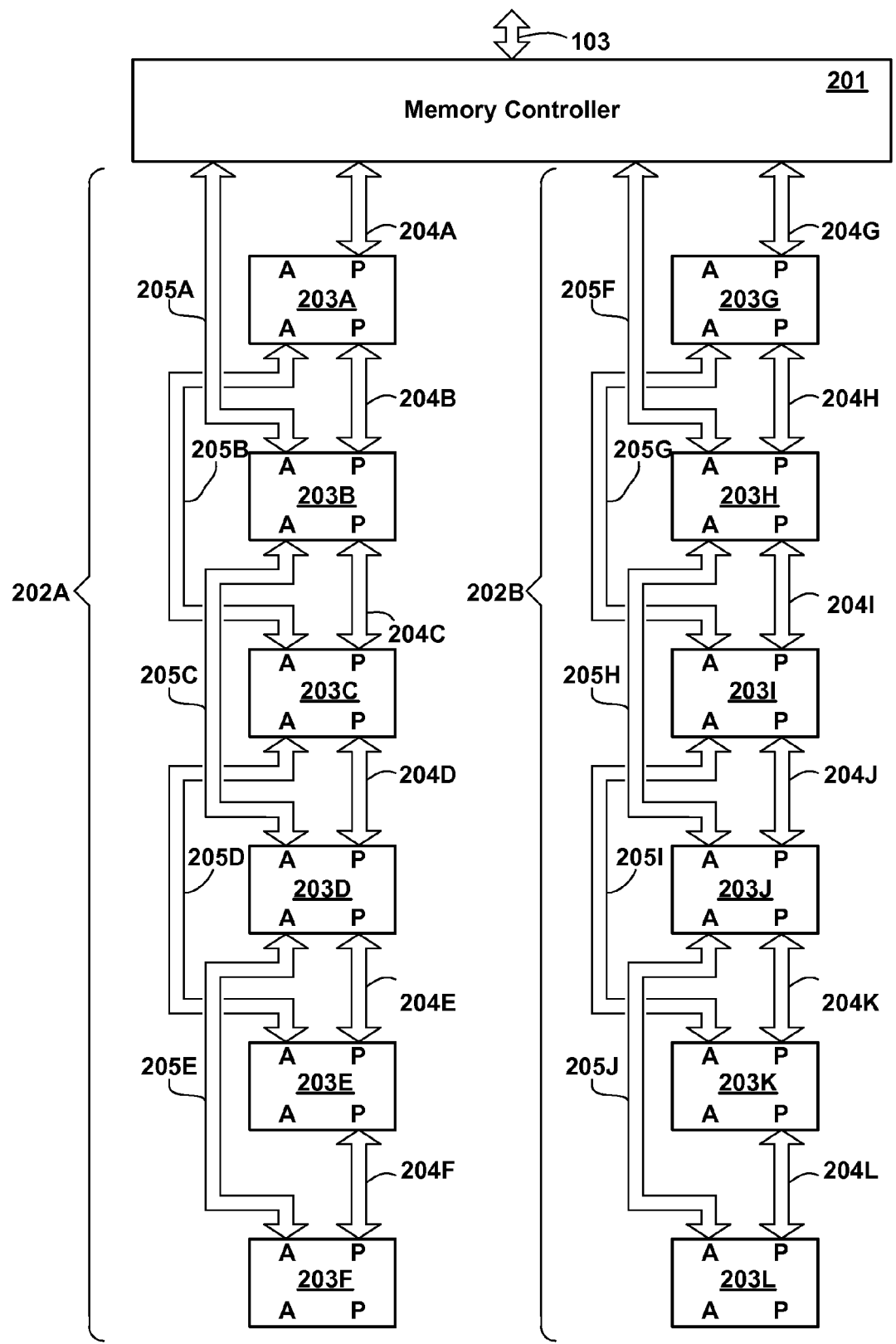
FIG. 2 is a block diagram showing an exemplary basic configuration of a memory subsystem having two redundant daisy chains of memory modules driven directly by a memory controller, according to a variation of the preferred embodiment.
Figure 6:
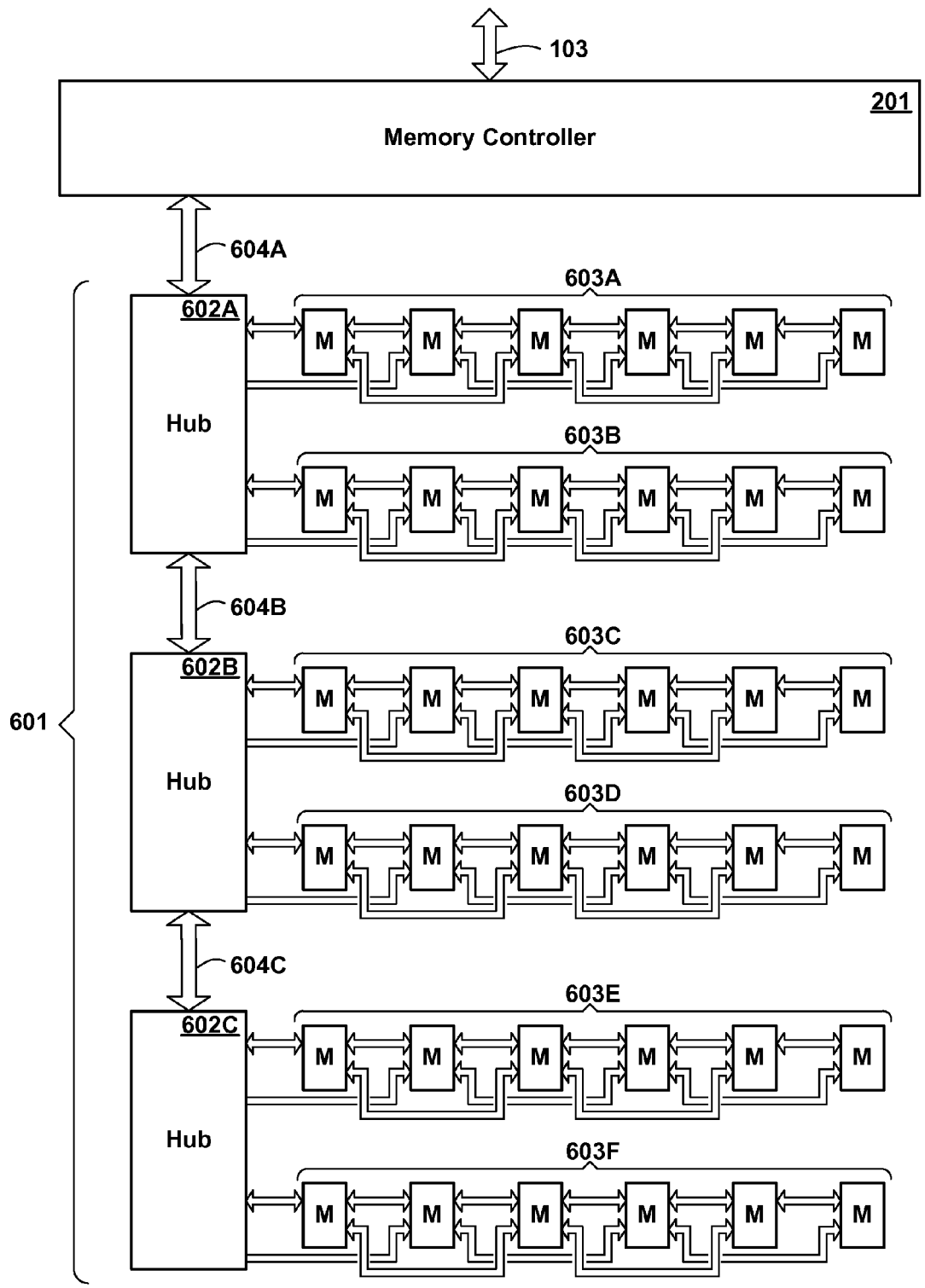
FIG. 6 is a block diagram showing the major components of a memory subsystem having a daisy chain of hub modules each driving redundant daisy chains of memory modules, according to another variation of the preferred embodiment.

In accordance with the preferred embodiment, main memory 102 comprises multiple memory modules storing data at addressable locations, and arranged in one or more redundant daisy chains. In the case of smaller memory subsystems, one or more daisy chains of memory modules may be driven directly by a memory controller, which is in turn in communication with processor/memory bus (also called a front-side bus) 103. FIG. 2 is a block diagram showing an exemplary basic configuration of two daisy chains of memory modules driven directly by a memory controller, according to a variation of the preferred embodiment. For larger memory subsystems, the daisy-chain concept can be expanded to include chains of hub modules, each hub supporting one or more chains of memory modules, as described in greater detail herein. FIG. 6 is a block diagram showing the major components of a memory subsystem having a daisy chain of hub modules, according to another variation of the preferred embodiment.

Referring to FIG. 2, a memory subsystem (which may be all, or a portion of, main memory 102) comprises memory controller 201 which is coupled to system processor/memory bus 103 (also known as front-side bus) for communication with one or more processors. Memory controller 201 in turn supports one or (typically) multiple redundant daisy-chained sets 202A, 202B (herein generically referred to as feature 202) of buffered memory chip modules 203A-L (herein generically referred to as feature 203), of which two sets or daisy chains are shown in FIG. 2. Although a single memory controller and attached memory chips are represented in FIG. 2, a main memory may contain multiple memory controllers, each supporting a respective one or more daisy chains of attached memory chips.

Each daisy-chained set 202 of memory chips 203 comprises a respective set of primary point-to-point links 204A-L (herein generically referred to as feature 204) and a respective set of alternate point-to-point links 205A-J (herein generically referred to as feature 205). Primary point-to-point link 204A runs from memory controller 201 to the first buffered memory chip 203A in the chain 202A, and successive point-to-point links 204B-F run from each buffered memory chip in the chain to the next buffered memory chip in the chain, until the end of the chain is reached. Alternate point-to-point links generally skip every other module as shown. E.g., alternate point-to-point link 205A runs from memory controller 201 to the second buffered memory chip 203B in chain 202A, alternate link 205B runs from the first buffered memory chip 203A to the third buffered memory chip 203C, and so on. Although a memory controller supporting two daisy-chains 202A, 202B is illustrated in FIG. 2, each daisy chain having six memory modules, the number of such daisy chains and the number of memory modules in each chain may vary. There could be as little as one daisy chain, but there are typically more.

Preferably, each point-to-point link 204, 205 comprises a respective outbound data portion having multiple digital signal lines and a respective inbound data portion also having multiple signal lines, i.e., on any single physical signal line, data moves in only one direction. The outbound portion is used for transmitting data in an outbound direction, i.e., in a direction away from memory controller 201. The outbound portion may include a set of command/address lines and a separate set of write data lines. The command/address lines transmit address and command data in an outbound direction to the chips. The write data lines transmit write data in an outbound direction, i.e. data coming from memory controller 201 (which obtained it over front-side bus 103) which is to be written to a memory address specified on the command/address lines. Although separate sets of dedicated lines are described herein for command/address data and for write data, it would alternatively be possible to use a single shared set of lines which transmit both command/address and write data in a time-multiplexed fashion. The inbound data portion transmits read data in an inbound direction, i.e., data read from a memory address responsive to a read command previously sent on the command/address lines of outbound portion.

In operation, memory controller 201 receives commands over front-side bus 103, and determines the daisy chained set 202 to which the command applies, i.e., the set in which the applicable address is located. In the discussion herein, it is assumed for simplicity that commands are either read commands or write commands to specific addresses, although some architectures may support other types of commands. Controller 201 then transmits each command and address on the command/address lines of outbound portion of a first link (which may be a primary or alternate link) in the applicable daisy-chained set (and, for a write command, transmits the applicable write data on the write data lines of outbound portion). This data is received by a memory module 203, and as necessary re-transmitted in a subsequent bus cycle to another memory module 203 in the daisy chained set 202. Re-transmission continues until the command/address data (and optional write data) reaches the memory module to which it is applicable. At that point, the memory module writes data to the specified address, or reads data at the specified address. In the case of a read, the module transmits the read data toward the memory controller on the inbound data portion of a primary or alternate link 204, 205. This read data is re-transmitted by every intermediate module in the daisy-chained set in subsequent bus cycles, until it reaches memory controller 201, from which it is transmitted via front-side bus 103 to the requesting entity.

In the preferred embodiment, upon failure of any single memory module in a daisy chain 202 of modules, at least one alternate path is chosen to by-pass the failing module, so that it is still possible to communicate with other modules in the chain. As used herein, "failure" means a failure in the communications links, ports, internal routing hardware which routes data from one port to another, or any other component required for communicating data in the daisy chain; a failure in some portion of the memory cell array, which does not affect the ability of a module to receive data and re-transmit it to other modules in the daisy chain, would not necessarily require using alternate paths to by-pass the failing module, as described herein. Depending on the type of failure (e.g., in a single port or link), it may even be possible to access data in the affected module, but this can not be assured. The primary effect of the redundant links is to assure that data in the unaffected modules downstream of the affected module can still be accessed.

In the preferred embodiment, each memory module 203 is capable of receiving data in either its primary or alternate port, and re-transmitting it in either port, regardless of the port in which it was received. Therefore there are multiple possible paths to each module (with the possible exception of the first module in the chain). For example, memory module 203D could be reached by using primary paths 204A, 204B, 204C and 204D. It could alternatively be reached by using alternate paths 205A and 205C. It could further be reached by using a combination of primary and alternative paths, e.g., primary path 204A, followed by alternate path 205B, followed by primary path 204D. This ability to use a combination of paths provides redundancy against any single failure in the chain. For example, if module 203B were to fail, it would not be possible to reach module 203D using only the primary paths, or using only the alternate paths, but it can be reached by the combination of paths 204A, 205B and 204D.

In the preferred embodiment, alternate links 205 are not merely idle until some failure of a module or primary link is detected, but are used even in the absence of such a failure to reduce path length to modules, particularly those near the end of the chain, to increase bandwidth and/or to balance load. Preferably, data traffic on the daisy chain is divided among the primary and alternate links to achieve some optimum combination of average path length and bandwidth. Referring again to the configuration of FIG. 2, it will be observed that it is possible to reach module 203F, the last module in chain 202A, in three hops from memory controller 201, by traversing alternate link 205A to module 203B, link 205C to module 203D, and link 205E to module 203F, and thus by using alternate length the path length can be reduced, and traffic can be unloaded from the primary links to the alternate links to improve bandwidth. Similar routings can be made for other modules, which may involve combinations of primary and alternate links. Furthermore, these routings need not be fixed, but may vary according to a predetermined allocation or according to dynamic usage criteria.

In an exemplary embodiment, each point-to-point link 204, 205 is a high-speed wide serial link, i.e., it comprises multiple signal lines in parallel, but the number of lines is not sufficient to transmit a full command/address or accessible unit of data (i.e., the amount of data transferred in a single data access) in a single bus cycle. Multiple bus cycles are required to transmit a single command/address (and optional accessible unit of write data) on an outbound bus portion, or accessible unit of read data on inbound portion. In one exemplary embodiment, an accessible unit of data is 8 bytes, it being understood that a larger or smaller granularity could be employed. In addition to the data (8 bytes or 64 bits), various bits are used in the outgoing command for a command, a destination address (and optionally, a path to that address), an error correction code (ECC), and other optional data such as a transaction identifier, which in total could exceed 100 bits. The number of I/O lines on which outbound command data is carried times the number of bus cycles required to transmit a single command is the total number of bits of command data supported by the applicable protocol. The inbound data lines generally support fewer bits, since it is not necessary to repeat the destination address or command, but preferably the number of bus cycles required to transmit inbound data responsive to a single read command is the same as the number of bus cycles required to transmit an outbound command. It will be understood that parameters such as the number of lines, the number of serial bus cycles required for each command or data, bus frequency, etc. could vary. It should further be understood that memory chips 203 may have apportionable bus width capability in which the width of the different bus portions is variably configurable, as described in the above referenced related patent applications.

The basic redundant daisy chain configuration of FIG. 2 provides the capability to access any memory module in the daisy chain which is downstream of a faulty module (there being no guarantee that the faulty module itself can be accessed. However, it does not necessarily provide redundancy against the failure of any single communications link. While most of the links are redundant, it will be observed that there is only a single link to the first module in the chain. Thus, for example, if link 204A fails, it will be possible to access data in modules 203B-F by using alternate path 205A, but it will not be possible to access data in module 203A, even though the module itself may be functional.

To provide redundancy of the first link, it would be possible to provide an additional link running from the controller 201 to the alternate link port of module 203A, which is unused in the configuration of FIG. 2. However, this would require an additional port in the controller. Since memory chips are often constrained by their number of I/O lines, the additional port on the memory controller may restrict the number of daisy chains 202 supported by a single controller. A preferable alternative is to wrap the alternate links from the last (or next to last) module in the chain to the beginning of the chain.

Figure 3:
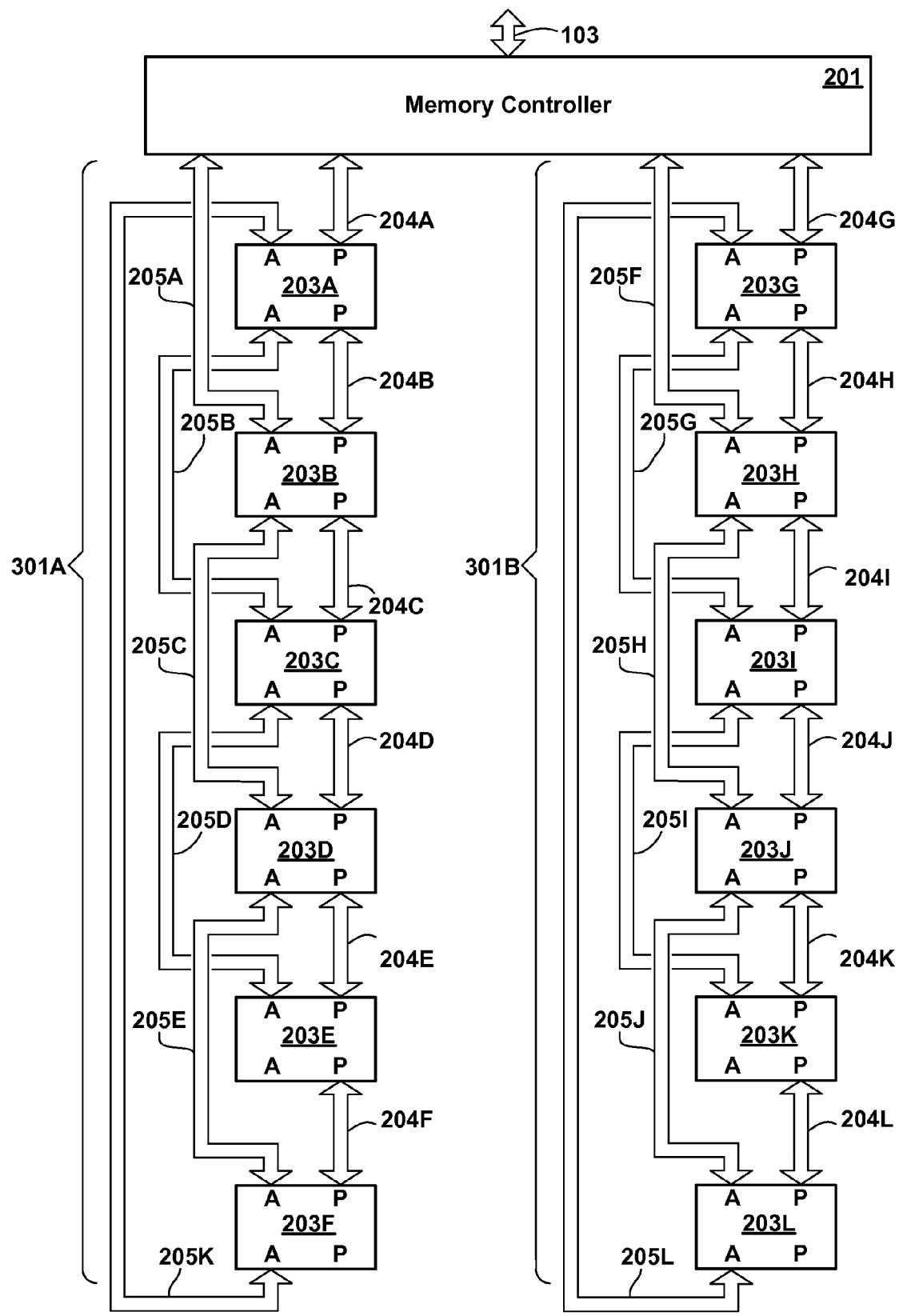
FIG. 3 is a block diagram showing a first alternative configuration of a memory subsystem having two redundant daisy chains, according to another variation of the preferred embodiment.

FIG. 3 shows an alternative configuration of daisy chains, in which the alternate links are wrapped to the beginning of the chain, according to a variation of the preferred embodiment. As shown in FIG. 3, each daisy chain 301A, 301B (herein generically referred to as feature 301) of memory modules 203 includes the same elements shown in FIG. 2 and described above. Additionally, each chain 301 includes a respective alternate path link 205K, 205L which wraps from the end of the chain to the first module in the chain. This alternate path provides a redundant link to the first module in the chain, in the event of failure of the first link 204A, 204G. For example, if link 204A were to fail, it would still be possible to access module 203A by a path through alternate links 205A, 205C, 205E and 205K. It will be appreciated that redundant links 205K, 205L could have been connected either to the last module in the respective chains (i.e., modules 203F, 203L) or to the next to last module (i.e., modules 203E, 203K).

Figure 4:
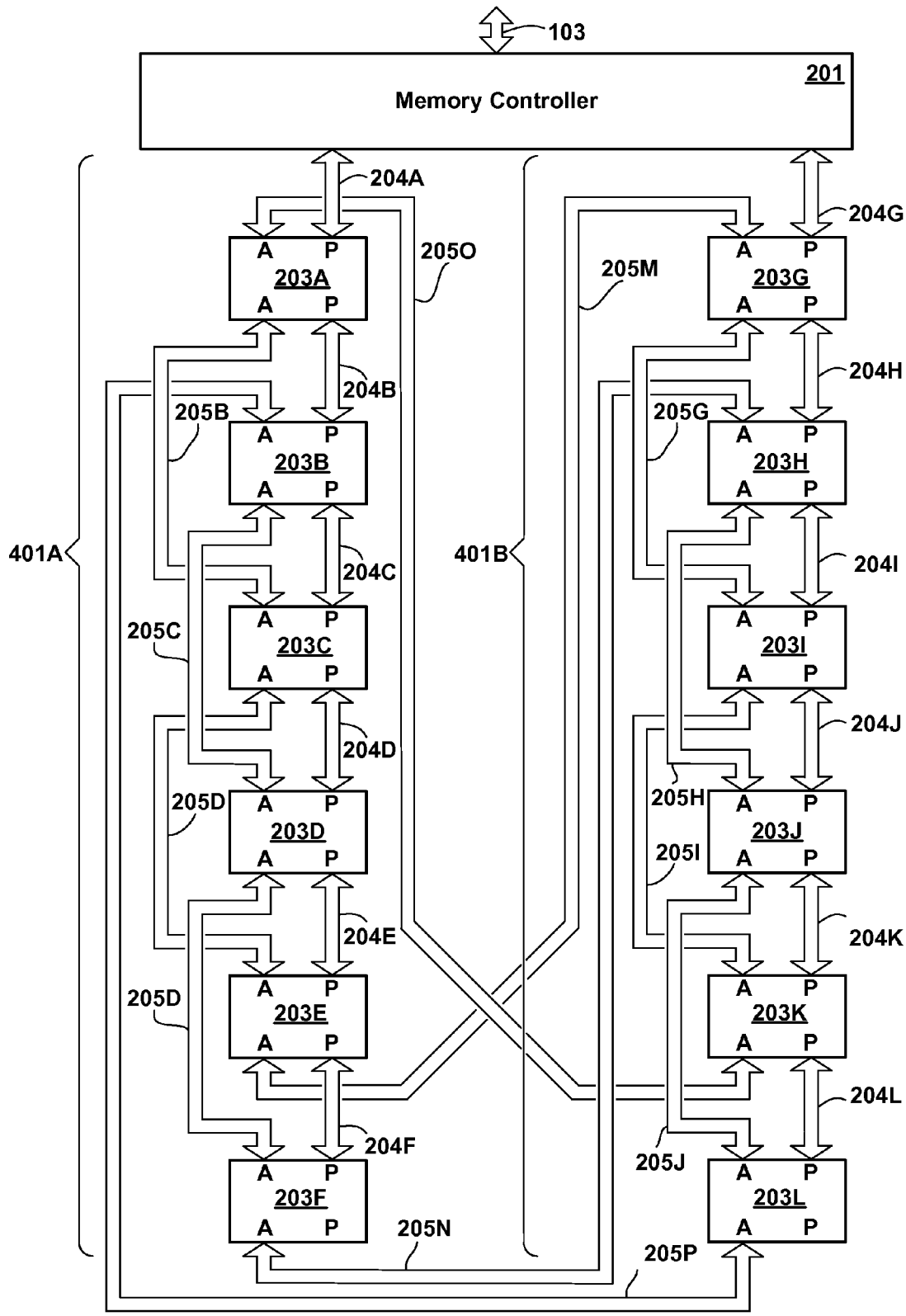
FIG. 4 is a block diagram showing a second alternative configuration of a memory subsystem having two redundant daisy chains, according to another variation of the preferred embodiment.

The concept of wrapping the end of one chain to the beginning can be applied to cross-link multiple chains, and thus reduce the number of ports required in the memory controller while still maintaining redundancy. FIG. 4 shows another alternative configuration of daisy chains, in which alternate links are wrapped to cross link a pair of daisy chains, according to a variation of the preferred embodiment.

Referring to FIG. 4, two cross-linked daisy chains 401A, 401B (herein generically referred to as feature 401) of memory modules 203 are shown. Cross-linked daisy chains 401 are similar in configuration and operation to daisy chains 201 and 301 of FIGS. 2 and 3, except for the configuration of the alternate links. As shown in FIG. 4, alternate links 205B-205E connect the modules of daisy chain 401 in the same manner as these alternate links connect the modules of daisy chain 201A of FIG. 2 or chain 301A of FIG. 3; and alternate links 205G-205J connect the modules of daisy chain 401B in the same manner as the same links connect the modules of daisy chain 201B of FIG. 2 or chain 301B of FIG. 3. However, chain 401A does not contain an alternate link 205A running directly from controller 201 (as chains 201A or 301A do), and similarly for chain 401B. Instead, alternate links 205M and 205N wrap from modules 203E and 203F of chain 401A to modules 203G and 203H, respectively, of chain 401B. Similarly, alternate links 205O and 205P wrap from modules 203K and 203L of chain 402B to modules 203A and 203B, respectively, of chain 401A.

The cross-linked chains of FIG. 4 are fully redundant against a single memory module or link failure in either chain. If, for example, module 203A were to fail, it would be possible to access module 203B (or any other module in chain 401A) by traversing links to the end of chain 401B (i.e., to module 203L), and taking alternate link 205P to module 203B. Similarly, if primary link 204A were to fail, it would still be possible to access module 203A by traversing chain 401B to module 203K, and taking alternate link 205O to module 203A.

When compared with the configuration of FIG. 3, the cross-linked chains of FIG. 4 do not provide additional redundancy, and path lengths may in some circumstances be longer. However, this alternate configuration does have the beneficial effect of requiring fewer ports in memory controller 201, since the memory controller need not provide ports for the alternate links. Thus, full redundancy is achieved without any additional ports in the memory controller when compared to a non-redundant configuration, i.e., a daisy chain configuration without any alternate links. Reduction of memory controller ports is potentially a significant advantage, since memory subsystems may be constrained by the number of I/O lines which a single chip, such as a memory controller, can support. Furthermore, cross-linking of chains may offer greater flexibility to balance load among different chains, and/or greater redundancy where multiple chains are driven by separate entities disclosed in greater detail herein. Although FIG. 4 shows only a pair of chains which are cross-linked, it will be appreciated that a larger number of chains could alternatively be cross-linked. For example, chain A's end could be linked to the beginning of chain B, chain B's end linked to the beginning of chain C, and chain C's end linked to the beginning of chain A, and that this principle could be expanded for a larger number of cross-linked chains. Furthermore, although the alternate links directly from the memory controller (i.e., links 205A, 205F of FIG. 2 or 3) have been removed in the configuration of FIG. 4, it would alternatively be possible to provide cross-linked chains in which such alternate links are not removed.

Figure 5:
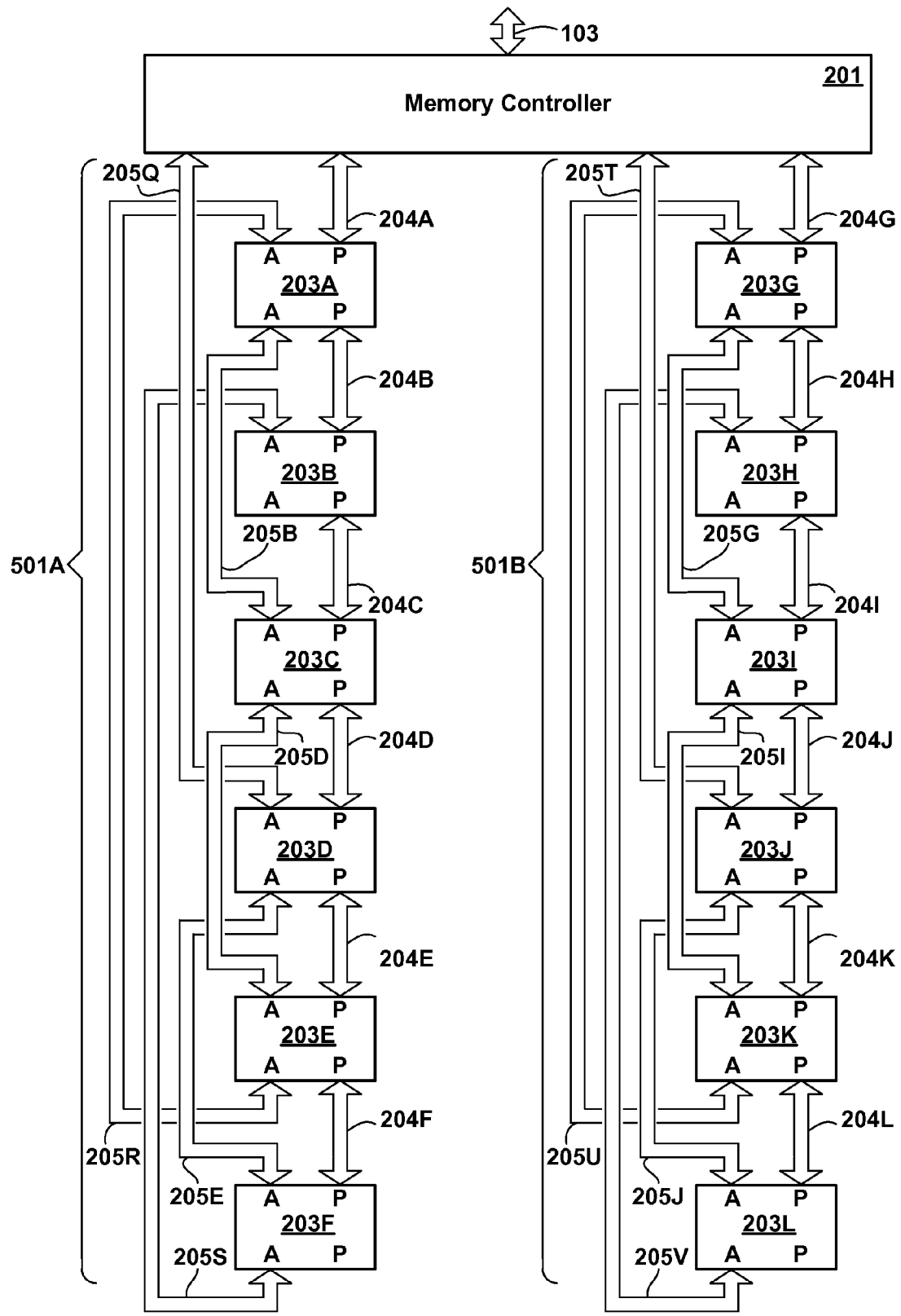
FIG. 5 is a block diagram showing a third alternative configuration of a memory subsystem having two redundant daisy chains, according to another variation of the preferred embodiment.

The concept of wrapping the end of one chain to the beginning of itself (or another chain) can be further applied to another variation of a daisy chain configuration, in which the first alternate link runs to a module further down the chain, to reduce average latency. FIG. 5 shows such an alternative configuration of daisy chains, according to a variation of the preferred embodiment.

Referring to FIG. 5, two end-wrapped daisy chains 501A, 501B (herein generically referred to as feature 501) of memory modules 203 are shown. End-wrapped daisy chains 501 are similar in configuration and operation to daisy chains 201 and 301 of FIGS. 2 and 3, except for the configuration of the alternate links 205. As shown in FIG. 5, alternate link 205A, 205F running to the second module in the chain (of FIG. 2 or 3) has been removed. In its place, the first alternate 205Q in chain 502A connects memory controller 201 to module 203D, lying in the middle of the chain (and similarly link 205T connects the controller to module 203J in chain 501B). The alternate links from the final two modules 203E, 203F of chain 501A then wrap to the first two modules 203A, 203B, via alternate links 205R, 205S, respectively (and similarly alternate links 205U, 205V wrap from the final two modules of chain 501B to the first two modules).

As in the configurations of FIG. 3 and FIG. 4, both chains 501 of FIG. 5 are fully redundant against a single memory module or link failure in either chain. If, for example, module 203A were to fail, it would be possible to access module 203B by traversing alternate link 205Q to module 203D, alternate link 205E to module 203F, and alternate link 205S to module 203B. Similar paths could be found to any other module in the presence of a single link or module failure.

When compared with the configuration of FIG. 3, the configuration of FIG. 5 does not provide additional redundancy, and does not reduce the number of memory controller ports, but it can significantly reduce path length where all modules and links are functioning. For example, if all of the modules and links are operational, the maximum path length from the memory controller in the exemplary configuration of FIG. 5 is two hops. Module 203A can be reached by traversing primary link 204A; module 203B can be reached by traversing primary links 204A and 204B; module 203C can be reached by traversing primary link 204A and alternate link 205B; module 203D can be reached by traversing alternate link 205Q; module 203E can be reached by traversing alternate link 205Q and primary link 204E; and module 203F can be reached by traversing alternate link 205Q and alternate link 205E. It will be appreciated that the first alternate link 205Q could have run to a different module in chain 501A. As a further alternative, an alternate link could run to a last module in a chain, and the alternate links thereafter could traverse the chain in a direction opposite the primary links.

For larger memory subsystems, the number of memory modules supported can be increased without proportional increases in daisy chain length or number of memory controller ports by using one or more chains of hubs, each hub supporting one or more daisy chains of memory modules. A simplified representation of such a configuration is shown in FIG. 6.

Referring to FIG. 6, memory controller 201 is coupled to system processor-memory bus 103, and in turn supports a memory chip bus configured as a daisy-chained set 601 of hub modules 602A-C (herein generically referred to as feature 602). Each hub module 602 is coupled to a preceding hub in the chain (or to the memory controller) by a respective point-to-point link 604A-C (herein generically referred to as feature 604). Each hub module in turn supports one or more daisy chains 603A-F (herein generically referred to as feature 603) of memory chips 204. The hub serves only as a conduit for communications with the memory chip modules attached to it, and with the next hub in the chain. It typically contains one or more buffers for buffering data being transmitted, state registers, and so forth, but does not contain addressable memory storage locations. Although a memory controller 201 and a single daisy chain 601 of three hub modules 602 is shown in FIG. 6 for clarity of illustration, it will be understood that main memory may contain multiple memory controllers, that each controller may support multiple daisy chains 601 of hub modules, and that the number of hub modules in each daisy chain 601 of hub modules may vary, and need not be the same for all daisy chains. It will further be understood that while each hub is shown in FIG. 6 supporting two daisy chains 603, the number of daisy chains supported by each hub could vary, and need not be the same for all hubs.

Each daisy chain 603 of memory chips coupled to a hub operates as described above, but is coupled to a hub 602 instead of directly to the controller. Although a daisy chain 603 of memory modules is shown in FIG. 6 having a configuration similar to that of FIG. 2, it will be understood that daisy chain 603 could alternatively have a configuration as shown and described in FIG. 3 or in FIG. 4 or in FIG. 5, or some combination or variation thereof, and could operate as described in any of the accompanying descriptions.

In operation, memory controller 201 receives commands over front-side bus 103, and re-transmits each command on an applicable daisy chain 601 of hub modules to the hub which supports the memory address referenced in the command. I.e., the command is transmitted over link 604A to the first hub in the chain, and continues down the chain as required to reach the applicable hub. Each hub in the chain which receives the command determines whether the command applies to it, i.e., whether it references a memory address in a memory module supported by the hub. If not, the command is forwarded down the daisy chain 601 of hub modules to the next hub. If so, then the hub determines the applicable daisy chain 603 of memory modules, and forwards the command on the applicable daisy chain of memory modules to the addressed memory module as previously described. Any data requested from the memory module is re-transmitted up the chains in reverse order to memory controller 201, from which it is transmitted via front-side bus 103 to the requesting entity.

Each hub 602 is intended primarily as a data buffering and routing device which performs minimal processing of data. Accordingly it is preferred that each point-to-point link 604 be a high-speed wide serial link, comprising multiple signal lines in parallel. Similarly to the daisy chains of memory chip modules, each point-to-point link 604 in the hub daisy chain 601 comprises a respective outbound data portion and an inbound data portion. The outbound portion is used for transmitting data in an outbound direction, i.e., in a direction away from memory controller 201. In the preferred embodiment, the outbound portion includes a set of command/address lines and a separate set of write data lines. The inbound data portion transmits read data in an inbound direction, i.e., data read from a memory address responsive to a read command previously sent. Point-to-point links 604 could be identical in operating protocol to links 204, 205, or alternatively could be designed to operate at a higher data bandwidth than the memory module links. For example, links 604 might be identical in all respects except that they operate at a higher bus frequency than links 204, 205. Alternatively, links 604 might operate at the same frequency, but comprise a larger number of lines in parallel to support higher data bandwidth. Finally, links 604 may require additional address or routing bits to specify an applicable hub and/or daisy chain of memory modules, which are not required in links 204, 205 because these are implicit.

Figure 7:
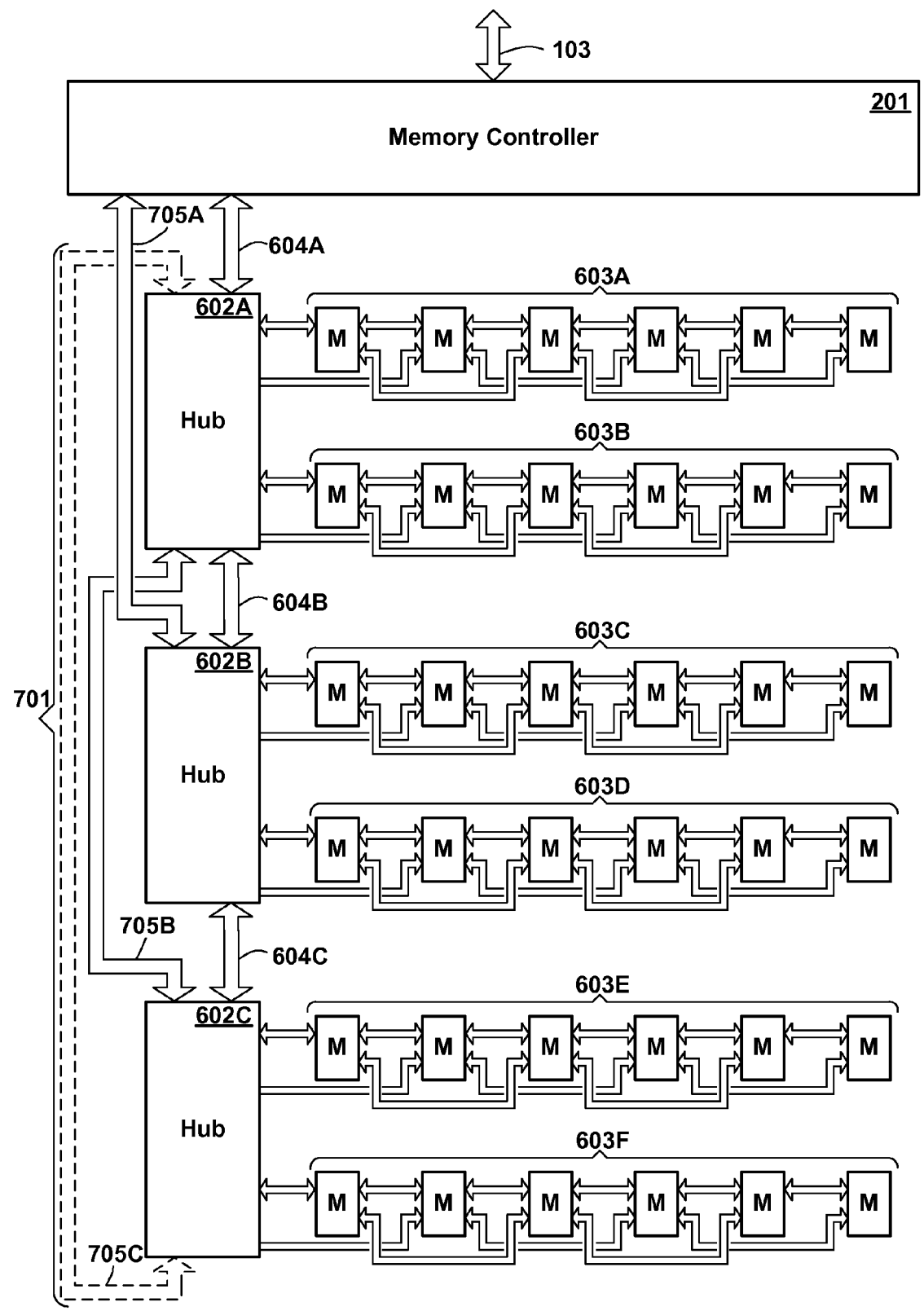
FIG. 7 is a block diagram showing the major components of a memory subsystem having a redundant daisy chain of hub modules each driving redundant daisy chains of memory modules, according to another variation of the preferred embodiment.

The use of hubs as shown and described in FIG. 6 greatly expands the number of memory modules which may be supported without using extremely long daisy chains (and consequent long latency of access to memory). However, it introduces additional component interdependencies. It will be observed that the daisy chain 601 of hub modules is non-redundant, so that if any hub module or link in the chain were to fail, all downstream hub modules would be unable to communicate with memory controller 201, resulting in loss of access to all memory modules connected to those hubs. To increase redundancy where hubs are used and provide a more robust memory subsystem, the configuration of FIG. 6 may be modified by providing redundant daisy chain links, using the same principle of redundant daisy chain links described above with respect to daisy chains of memory modules. FIG. 7 is a simplified representation of a memory subsystem configuration using redundant chains of hub modules.

Referring to FIG. 7, memory controller 201 is coupled to system processor-memory bus 103, and in turn supports a memory chip bus configured as a daisy-chained set 701 of hub modules 602A-C. Each hub module 602 is coupled to a preceding hub in the chain (or to the memory controller) by a respective primary point-to-point link 604A-C, and in turn supports one or more daisy chains 603A-F of memory chips 203, as shown and described above with respect to FIG. 6. Each hub is further coupled to a hub which is two links up the chain (or to the memory controller, if applicable) by a respective alternate point-to-point link 705A-B (herein generically referred to as feature 705). To provide additional redundancy for the initial primary point-to-point link 604A, the first hub is optionally coupled by an alternate point-to-point link 705C (shown in dashed lines to denote that it is optional) to the last or next to last hub in the chain, so that the alternate links wrap around to the beginning of the chain, in a manner analogous to that shown and described above in FIG. 3 for daisy chains 301 of memory modules. As a further alternative, where multiple hub chains are present, the hub chains could be cross-linked (not shown) in a manner similar to cross linked daisy chains 401 of memory modules shown and described above in FIG. 4 or wrapped (not shown) in a manner similar to daisy chains 501 of memory modules shown and described above in FIG. 5. As in the case of the configuration of FIG. 6, it will be understood that the number of controllers, daisy chains 701 of hubs, hubs 602 on each chain 701, daisy chains 603 of memory modules, and other parameters represented in FIG. 7 may vary.

The memory subsystem shown in FIG. 7 operates in essentially the same manner as that of FIG. 6 described above. However, in the event of failure of any single hub 602 or primary link 604, traffic is routed around the failing component through one or more alternate links 705, in a manner analogous to that described above with respect to daisy chains 202, 301, 401 and/or 501 of memory modules. Furthermore, in the absence of a failure of any component, alternate links 705 can be used to share some of the traffic and thus reduce the load on the primary links and/or reduce the path length to a hub.

While the use of redundant links in the chain of hubs provides additional redundancy, the configurations of FIG. 6 or 7 are still vulnerable to a significant memory loss if one of the hubs fails, since all the memory modules attached to that hub will then become unavailable. It would be possible to provide further redundancy in the event of failure of a hub by cross-linking the daisy chains of memory modules to other such daisy chains in served by different hubs. A simplified representation of such a cross-linked configuration is shown in FIG. 8.

Figure 8:
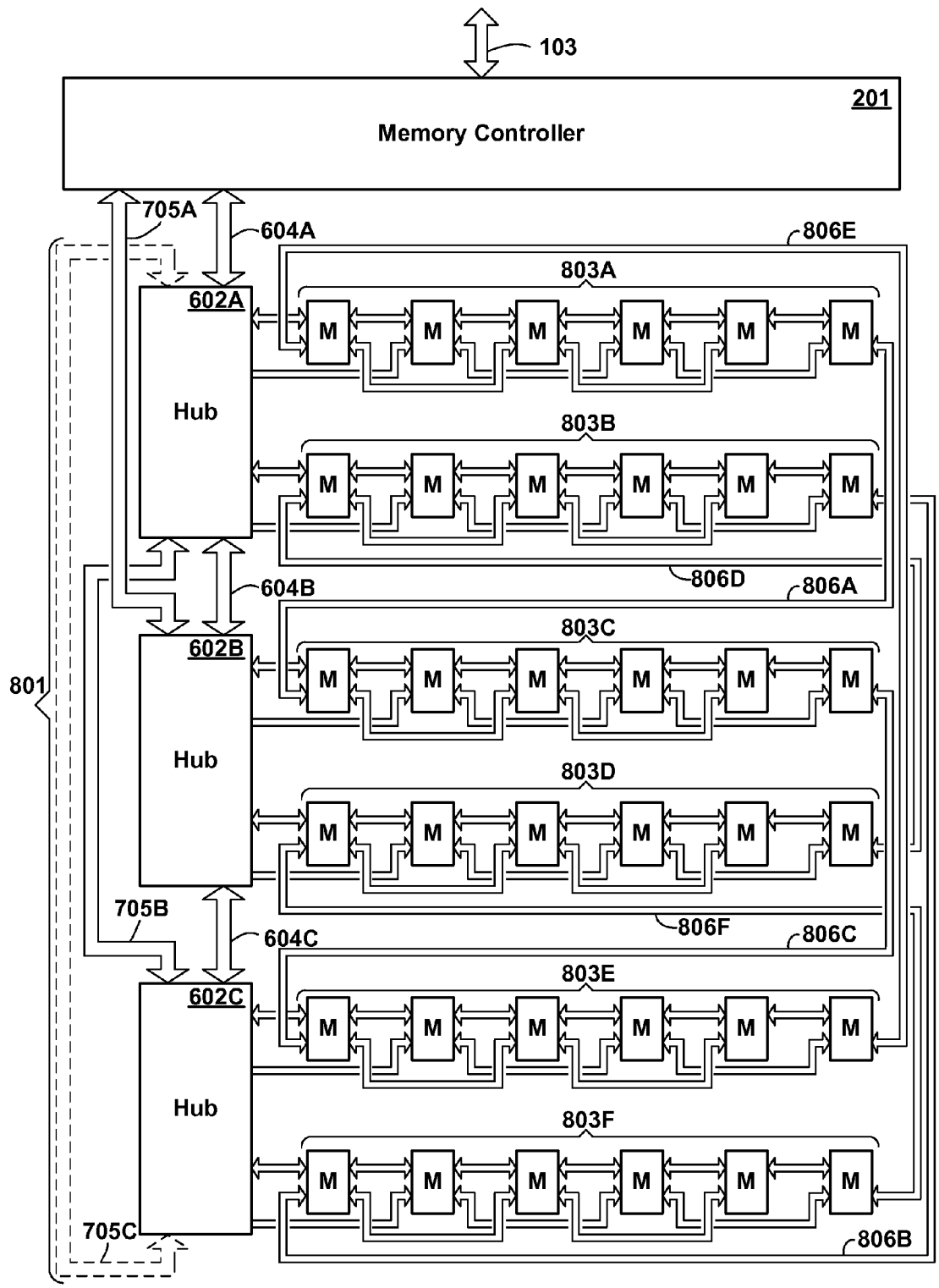
FIG. 8 is a block diagram showing the major components of a memory subsystem having a redundant daisy chain of hub modules each driving redundant cross-linked daisy chains of memory modules, according to another variation of the preferred embodiment.

Referring to FIG. 8, memory controller 201 is coupled to system processor-memory bus 103, and in turn supports a memory chip bus configured as a daisy-chained set 801 of hub modules 602A-C. Each hub module 602 is coupled to a preceding hub in the chain (or to the memory controller) by a respective primary point-to-point link 604A-C, and in turn supports one or more daisy chains 803A-F (herein generically referred to as feature 803) of memory chips 203. Alternate point-to-point links 705A-C provide additional redundancy, as explained above for the configuration of FIG. 7.

Each daisy chain 803 of memory modules is cross-linked to another daisy chain of memory modules by providing an alternate point-to-point link 806A-F, herein generically referred to as feature 806) running from the last module in one chain to a first module in another chain. Preferably, these cross links are configured such that a chain serviced by a first hub is cross-linked to a chain serviced by a second hub. In the preferred embodiment, these cross links are distributed to the extent possible among multiple hubs, so that different daisy chains attached to a single hub are cross linked to respective different daisy chains attached to respective different hubs.

For example, in the illustrative configuration of FIG. 8, chain 803A is cross-linked by alternate link 806A to chain 803C, while chain 803B (in the same hub as chain 803A) is cross-linked by alternate link 806B to chain 803F, which is in a different hub than chain 803C. The effect of this arrangement is that, in the event of failure of a single hub, the load otherwise handled by that hub is distributed among multiple alternate hubs.

In operation, alternate links 806 which cross link to different chains are generally only used in the event of a hub failure, or some other module failure making it impossible to access one or more memory modules by the normal route (although the remaining alternate links in a chain might be used as described earlier to reduce path length, increase bandwidth and/or balance workload, even in the absence of a failure). In case of such a failure, the alternate links are used to route data through a different hub, to the end of a chain 803, and thence through the applicable alternate link 806 to the head of the chain 803 containing the memory module to be accessed. If, for example, hub module 602B were to fail, so that communications with chains 803C and 803D through the normal paths are impossible, any communications from the memory controller intended for a module in chain 803C are instead routed to hub 602A, thence down to the end of chain 803A, thence via alternate link 806A to the first memory module in chain 803C, and thence to the destination memory module. Similarly, any communications intended for a module in chain 803D are instead routed to hub 602C (hub 602C being reached via alternate link 705B), thence down to the end of chain 803F, thence via alternate link 806F to the first memory module in chain 803D, and thence to the destination memory module. Data returned to the memory controller follows the reverse route. It will be observed that the traffic otherwise handled by failing hub 602B is thus divided between hubs 602A and 602C. The failure of a single hub will thus not cause loss of access to any memory modules, although the need to traverse longer path lengths down the daisy chains will increase memory access latency.

It will be understood that the various configurations of memory subsystems depicted in FIGS. 2-8 are merely exemplary configurations not intended to constitute an exhaustive description of all possible configurations, and that, in addition to those variations explicitly disclosed herein, many other variations and/or combinations of the exemplary configurations are possible.

Buffered memory chip module 203 is generally similar in design and operation to any of the buffered memory chips described in the patents and patent applications referenced above, except that it is modified to provide support for primary and alternate communication links 204, 205, and contains routing logic necessary for routing data along a correct path in accordance with the present invention.

Figure 9:
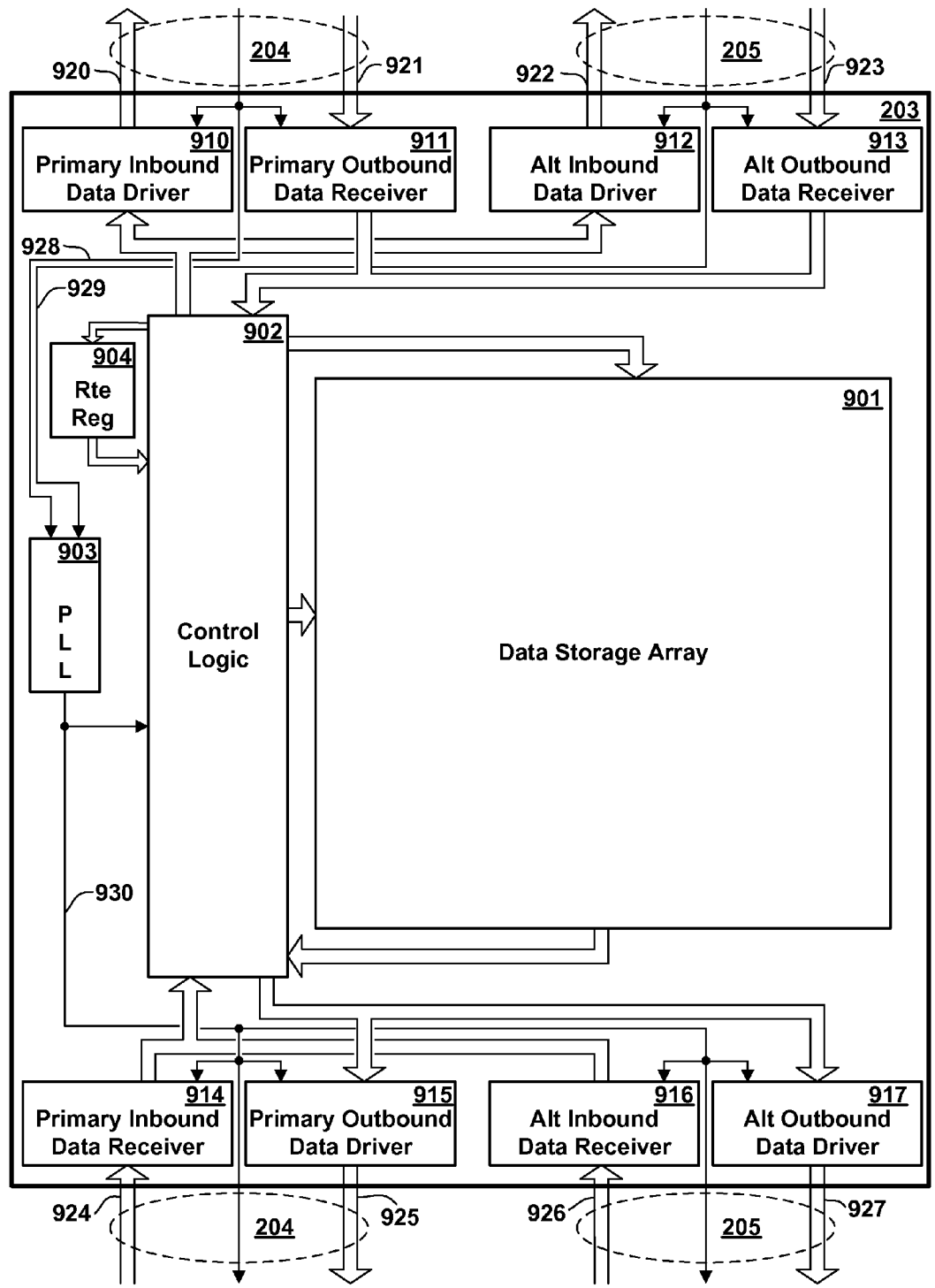
FIG. 9 is a block diagram of certain major internal components of a modified buffered memory chip module, according to the preferred embodiment.

FIG. 9 is a block diagram of certain major internal components of a modified buffered memory chip module 203 for supporting redundant communications paths in a daisy chain, according to the preferred embodiment. Buffered memory chip module 203 comprises a random access data storage array 901 for storing data at a plurality of memory addresses; control logic 902 for decoding received command information and controlling the operation of module 203; and phase locked loop (PLL) clock circuit 903 for generating bus and internal timing signals. Module 203 optionally contains routing register 904 for storing communications routing information, as described in greater detail herein. Memory chip module 203 further comprises various receive buffers 911, 913, 914 and 916 for receiving data through respective I/O lines each coupled to a respective external source, and drivers 910, 912, 915, and 917 for driving (transmitting) data through respective I/O lines each coupled to a respective external receiver.

As shown in FIG. 9, memory chip module 401 is coupled to two primary links 204 and two alternate links 205, one each for connecting with an upstream memory module, hub or controller, and the other for connecting with a downstream memory module. Preferably, inbound I/O lines 920 and outbound I/O lines 921 are coupled to the same external device; inbound lines 922 and outbound lines 923 are coupled to the same external device; inbound lines 924 and outbound lines 925 are coupled to the same external device; and inbound lines 926 and outbound lines 927 are coupled to the same external device. A pair of inbound and outbound lines coupled to the same external device forms a point-to-point communications link (204 or 205) to that device. Primary inbound data driver 910 drives inbound data on inbound data portion 920 of the upstream primary link to an upstream device; primary outbound data receiver 911 receives and buffers outbound data from the same upstream device on outbound data portion 921 of the upstream primary link. Alternate inbound data driver 912 drives inbound data on an inbound data portion 922 of the upstream alternate link to an upstream device, generally a different device than that to which the upstream primary link is coupled; alternate outbound data receiver 913 receives and buffers outbound data from the same upstream device.

PLL circuit 903 receives a bus clock signal from an external source and re-drives the signal to another external source, e.g., it receives the bus clock from a previous module (or memory controller or hub) in the daisy chain and re-drives it to a next chip in the chain. This signal is used to provide timing for transmissions on the data and command/address bus portions. Preferably, PLL circuit receives a primary input clock signal 928 and an alternate input clock signal 929, which are received from separate modules in the chain, and may be considered respective parts of the primary or alternate links. The clock signal is therefore redundant, and PLL could use either primary or alternate clock signal. PLL generates a single output clock signal 930, which is used for driving control logic 902 and for retransmission to a subsequent module on either primary or alternate downstream links. PLL preferably uses the primary clock signal input 928, if it is available. The alternate clock signal input 929 is used by PLL only if the primary is unavailable, e.g., the upstream module is failing; however, it is used in the alternate link ports (alternate inbound data driver 912 and alternate outbound data receiver 913) whenever they are receiving or transmitting data.

In accordance with the preferred embodiment of the present invention, memory chip module 203 receives a command from an upstream device in either primary outbound receiver 911 or alternate outbound receiver 913. Upon receipt of the command, control logic 902 analyzes selective address and/or routing bits to determine whether the command is intended for itself. If the command is intended for itself, then control logic causes the command to be executed in module 203. Generally, the command is either a read or write command, meaning that a memory address will be decoded; a corresponding location in data storage array 901 will be read or written to, as the case may be; and data read from the location (and/or, depending on the architecture, a write acknowledgment) will be transmitted upstream on either primary inbound driver 910 or alternate inbound driver 912. It will be understood that the applicable memory architecture could support other types of commands, such as reporting status, changing mode, etc. In particular, according to one variation of the preferred embodiment described herein, a command could alter the contents of routing register 904.

If a received command is not intended for the memory module receiving it, it is forwarded to another module in the daisy chain, along either a primary or secondary link, i.e., it is transmitted on either primary outbound driver 915 or secondary outbound driver 917 to another module. Control logic 902 has the capability to route outbound data received in either of primary receiver buffer 911 or alternative receiver buffer 913, to either of primary outbound driver 915 or alternate outbound driver 917, i.e., the choice of primary or alternate outbound driver is not constrained by the link on which the command arrived. Similarly, the control logic has the capability to route inbound data received in either of primary receiver buffer 914 or alternative receiver buffer 916, to either of primary inbound driver 910 or alternate inbound driver 912.

The routing choice (i.e, to the primary or alternate outbound driver) may be controlled by routing bits in the data itself, or by routing information stored in routing register 904. In a first variation of the embodiments described herein, routing is controlled by bits in the data being transmitted. Specifically, the routing data within a data communication includes a set of bits specifying the path to be taken at each memory module which is traversed to reach a destination. Upon receipt of a command headed downstream in either the primary outbound receiver 911 or alternate outbound receiver 913, control logic 902 decodes these bits to determine an outgoing path to be taken (either the primary outbound driver 915 or alternate outbound driver 917). The procedure for inbound data could be similar (or alternatively, control logic 802 could save the routing by which the command requesting the inbound data originally arrived, and use the same routing for the inbound data).

An exemplary routing protocol is described as follows, it being understood that any or various alternative such protocols could be used. The exemplary protocol requires two fields in the outgoing command, one of which ('hops') specifies a number of hops to be taken, while the other ('path') specifies a path to be taken at each hop. The data in these fields is generated by controller 201 or an applicable hub 602. The number of bits required for the field 'hops' is therefore $\log_2$ (N) (rounded up to the nearest integer), while the number of bits required for the field 'path' is (N−1), where N is the maximum number of hops to be traversed. The field 'hops' is examined by control logic 902. If 'hops' is equal to zero, then the command is intended for the memory module, and control logic 902 accesses the appropriate locations in data storage array 901 to execute the command. If 'hops' is unequal to zero, the command is intended for another module; in this case, control logic 902 decrements 'hops' by one, and forwards the command to another module. Control logic determines the forwarding path by examining the first bit of 'path'. If this bit is a binary '0', then the command is forwarded to a next module via primary outbound data driver 915; if this bit is a binary '1', then the command is forwarded via alternate outbound data driver 917. In either case, the 'path' bits are shifted by one bit before forwarding, so that the next module to receive the command will examine the next bit of the 'path' field. A similar procedure may be followed for inbound data being returned in response to a command, except that the 'hops' field is unnecessary in this case, since the data will stop when it reaches a hub or controller.

In a second variation of routing embodiments, routing is controlled by optional routing register 904. Routing register 904 contains a plurality of entries, each specifying a command destination and corresponding path. The command destination is equivalent to selective bits of the memory address to be accessed by the command, and could be at the granularity of a memory module (so that all data accesses to a given memory module follow the same path), or could be a finer granularity (so that some data accesses to a given memory module follow one path, while others follow a different path). Upon receiving a command, selective bits of the module identifier and/or address within the module are compared to the entries in routing register 904 to determine a match. If a match is found, the corresponding path bit in the routing register specifies the path (primary or alternate) to be taken. The routing register may contain two path bits for each entry, one specifying an outbound path and the other specifying an inbound path, or may contain only a single bit for the outbound path, the inbound path being determined by following the original routing in reverse. The contents of routing register are preferably subject to change by special command issued by controller 201 or an applicable hub 602, so that routings can be altered from time to time to by-pass failing components or for other reasons.

It will be observed that the first routing variation described above has the disadvantage of requiring extra routing bits to be transmitted with each command, and thus consumes a small amount of additional bandwidth. However, it has the advantage of greater flexibility, since each data command can be routed independently of any other. Thus, if the controller or hub determines that a number of access commands could cause a performance bottleneck from using the same link or links, the controller could specify different paths for the commands to distribute the load among multiple links and avoid bottlenecks. The second routing variation, on the other hand, is relatively static; while routing can be changed from time to time by issuing special commands to change the contents of the routing registers 904, it is anticipated that this will only be done in response to configuration changes or component failure, and not done on a command by command basis.

Whether the dynamic routing of the first variation described above is used, or the more static routing of the second variation is used, routings are preferably chosen to utilize the available alternative links in the absence of component failure to reduce latency and/or balance load, and thus improve performance. I.e., while one of the advantages of alternative links is to provide redundancy in the event of component failure, the alternative links are preferably used for the additional purpose of improving performance, even when no component failure is present. The presence of alternative links means that traffic can be divided among multiple paths, so that each individual path carries less traffic, thus facilitating greater traffic on the network and/or improved performance. Additionally, as explained earlier and shown in some of the exemplary configurations (such as that of FIG. 5), the maximum number of hops can be significantly reduced by appropriate configuration of the alternate links, thus reducing latency of memory access.

Figure 10:
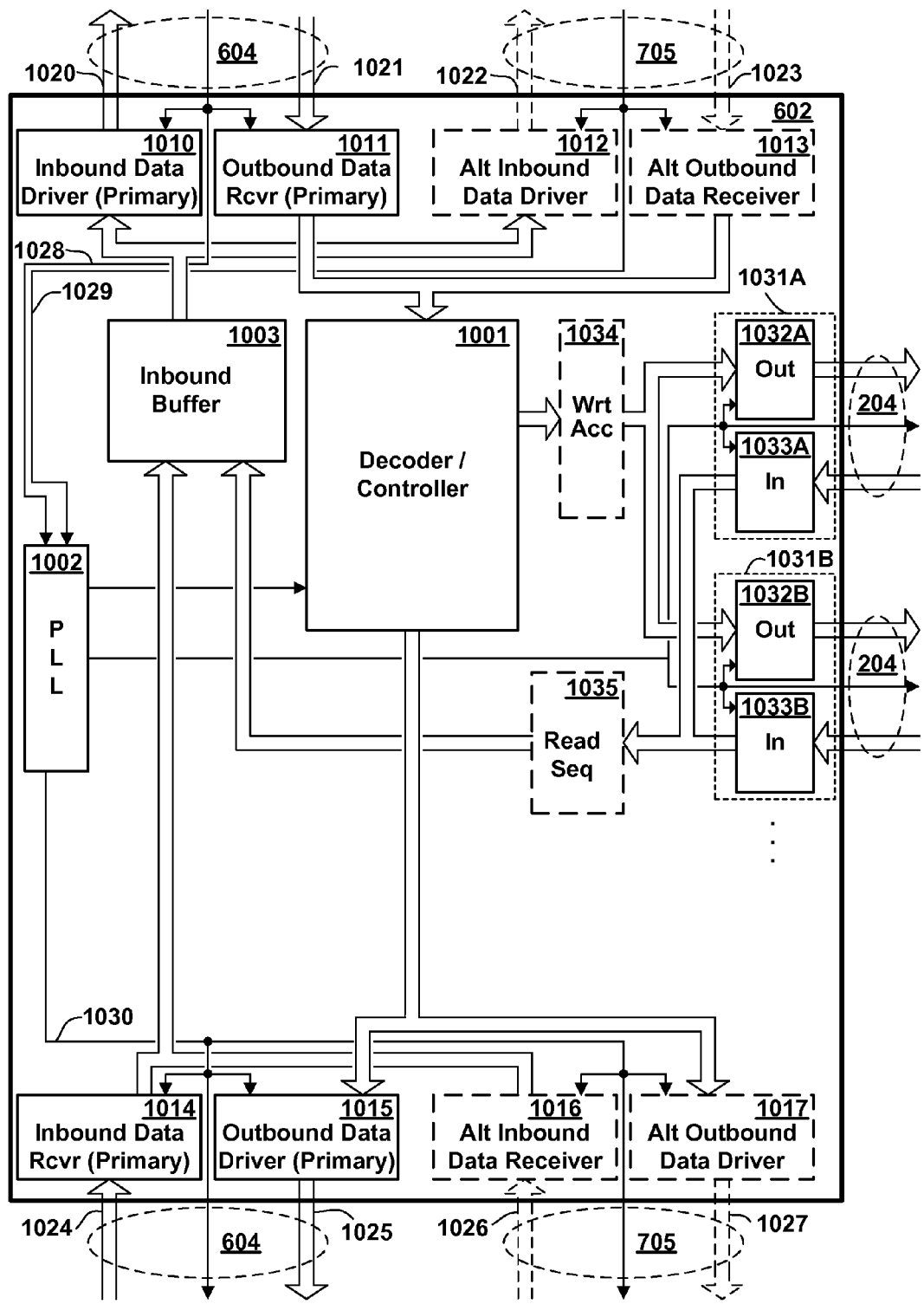
FIG. 10 is a block diagram showing certain major internal components of a hub for supporting one or more redundant chains of memory chips, according to the preferred embodiment.

FIG. 10 is a block diagram showing certain major internal components of a hub for supporting one or more redundant chains of memory chips, according to the preferred embodiment. Hub 602 is essentially a complex switch with the capability to buffer data, and optionally to accumulate/sequence data between busses of different data bandwidth. Hub 602 comprises a decoder/controller 1001 for decoding received addresses and controlling the operation of the hub; phase locked loop (PLL) clock circuit 1002 for generating bus timing signals; inbound data buffer 1003 for buffering inbound data; primary outbound data receiver 1011 for receiving outbound commands/data through I/O lines 1021 from a previous hub or memory controller in a chain of hubs 601, 701 or 801; outbound primary data driver 1015 for driving (transmitting) outbound commands/data through I/O lines 1025 to a next hub in a chain of hubs; primary inbound data receiver 1014 for receiving inbound data through I/O lines 1024 from a next hub in a chain of hubs; and primary inbound data driver 1010 for driving inbound data through I/O lines 1020 to a previous hub in the chain or the memory controller. For supporting redundant daisy chained hub configurations such as shown in FIG. 7 or 8, hub 602 optionally further includes alternate outbound data receiver 1013 for receiving outbound commands/data through I/O lines 1023 from a previous hub or memory controller in a chain of hubs 701 or 801; outbound alternate data driver 1017 for driving (transmitting) outbound commands/data through I/O lines 1027 to a subsequent hub in a chain of hubs; alternate inbound data receiver 1016 for receiving inbound data through I/O lines 1026 from a subsequent hub in a chain of hubs; and alternate inbound data driver 1012 for driving inbound data through I/O lines 1022 to a previous hub in the chain or the memory controller. I/O lines 1020, 1021, together with any timing signal line, form a primary hub-to-hub link 604, as do I/O lines 1024, 1025; I/O lines 1022, 1023 and I/O lines 1026, 1027 form respective alternate links 705.

Hub 602 further includes one or more memory chip ports 1031A, 1031B (of which two are shown in FIG. 10, herein generically referred to as feature 1031), each containing a respective outbound data driver 1032A, 1032B (herein generically referred to as feature 1032) for transmitting outbound commands/data through respective I/O lines to a memory chip 203 in a chain of memory chips, and a respective inbound data receiver 1033A, 1033B (herein generically referred to as feature 1033) for receiving inbound data through respective I/O lines from a memory chip in a chain of memory chips. In the preferred embodiment, each memory chip port 1031 is identical, and any port may be configured to server either a primary link 204 or an alternate link 205, the links shown in FIG. 10 being only exemplary.

It is possible that links 604, 705, which communicate data between hubs or between memory controller 201 and a hub, have the same number of data lines and operate at the same bus frequency as links 204, 205 which communicate data between memory chips or between a hub and a memory chip (although the hub links may require one or more additional addressing or routing lines). However, in one variation, links 604, 705 have a higher data bandwidth, either operating at a higher bus frequency or having a greater number of parallel lines or both. Hub optionally includes one or more write accumulators 1034 and one or more read sequencers 1035 (of which one each is shown). Write accumulator 1034 accumulates data to be transmitted to a memory chip at a lower bus frequency or slower rate from that at which it was received over a link 604, 705 from a previous hub or the memory controller. I.e., data received in multiple bus cycles over bus 604 or 605 is accumulated in a wider register until it is of sufficient width for transmitting at the lower bandwidth link 204 or 205 to a memory chip in a memory chip chain. After passing through write accumulator to adjust the width/frequency as necessary, received command/data intended for a memory chip is transmitted out chip on an appropriate outbound driver 1032. Read sequencer 1035 sequences inbound read data received over a link 204, 205 in an inbound receiver 1033 for transmission up the hub chain to the memory controller in multiple cycles on a primary link 604 or alternate link 705 in the hub chain. The sequenced data is placed in inbound buffer 1003 for re-transmission on a inbound driver 1010 or 1012 toward the memory controller.

In operation, decoder/controller 1001 decodes selective address/routing bits of a received command/address to determine whether the command is intended for a chain of memory chips supported by hub 602. If so, the incoming data is routed to the corresponding chain via a corresponding port 1031. If not, the incoming data is routed to either the primary or alternate outbound driver 1015 or 1017, passing it through hub 602 to the next hub in the chain of hubs. Routing of data transmissions can follow either of the two routing protocols explained above with respect to memory chips. I.e., an outgoing command may contain routing bits within the command, specifying a path to be taken from hub 602, such as any of the primary or alternate outbound data drivers 1015, 1017 to a next hub, or any of ports 1031. Alternatively, hub 602 may contain an optional routing register (not shown), similar in operation to optional routing register 904 of the memory chips 203, which specifies a routing for each destination address.

PLL circuit 1002 receives a bus clock signal from an external source and re-drives the signal to another external source, e.g., it receives the bus clock from a previous hub (or memory controller) in the daisy chain and re-drives it to a next hub in the chain. Preferably, each port 1031 further includes a clock re-driver for re-driving the bus clock signal to the corresponding chain of memory chips, although a clock for these chips might be generated by separate means. The clock signal derived from PLL 1002 is also provided to decoder/controller 1001 for controlling the internal operation of hub 602.

In operation, hub 602 receives successive portions of command/address data (and optionally write data) from the chain 404 in successive bus cycles. Preferably, address data identifying the output port 1031 or outbound driver to a next hub 1015, 1017 is included in the first bus cycle or cycles to reduce latency.

Various configurations have been described herein, but it will be understood that many additional options and alternative configurations are possible within the scope of the present invention. Certain alternatives are mentioned herein by way of example, it being understood that these examples are not intended to be exhaustive.

In all of the variations described above, a single controller 201 has been illustrated, and the entire system is therefore non-redundant in the event of failure of controller 201. Additional redundancy could be provided by a second controller, wherein each controller has access to the hubs in a chain via a set of primary and alternate links, in much the same manner as each of multiple hubs has access to the same chain of memory chips in the configuration of FIG. 8.

Although configurations showing redundant chains of memory chips and redundant chains of hubs are shown, it will be understood that the redundancy of the hub chain is independent of the redundancy of the memory chip chain, and it would as a further alternative be possible to provide a redundant hub chain in which the hubs drive non-redundant chains of memory chips.

In the preferred embodiments described above, the alternate links of a chain of memory chips or hubs skip over a single hub or chip to reach a next chip. However, it would alternatively be possible for alternate links to skip over a larger number of hubs or chips. For example, an alternate link might skip over two chips, or three chips, and wrap around to the beginning.

Although specific number of hubs and memory chips are shown in the various figures described herein, the number of devices in a chain of hubs or chips may vary, and need not be the same for all such chains.

Design Structure

Figure 11:
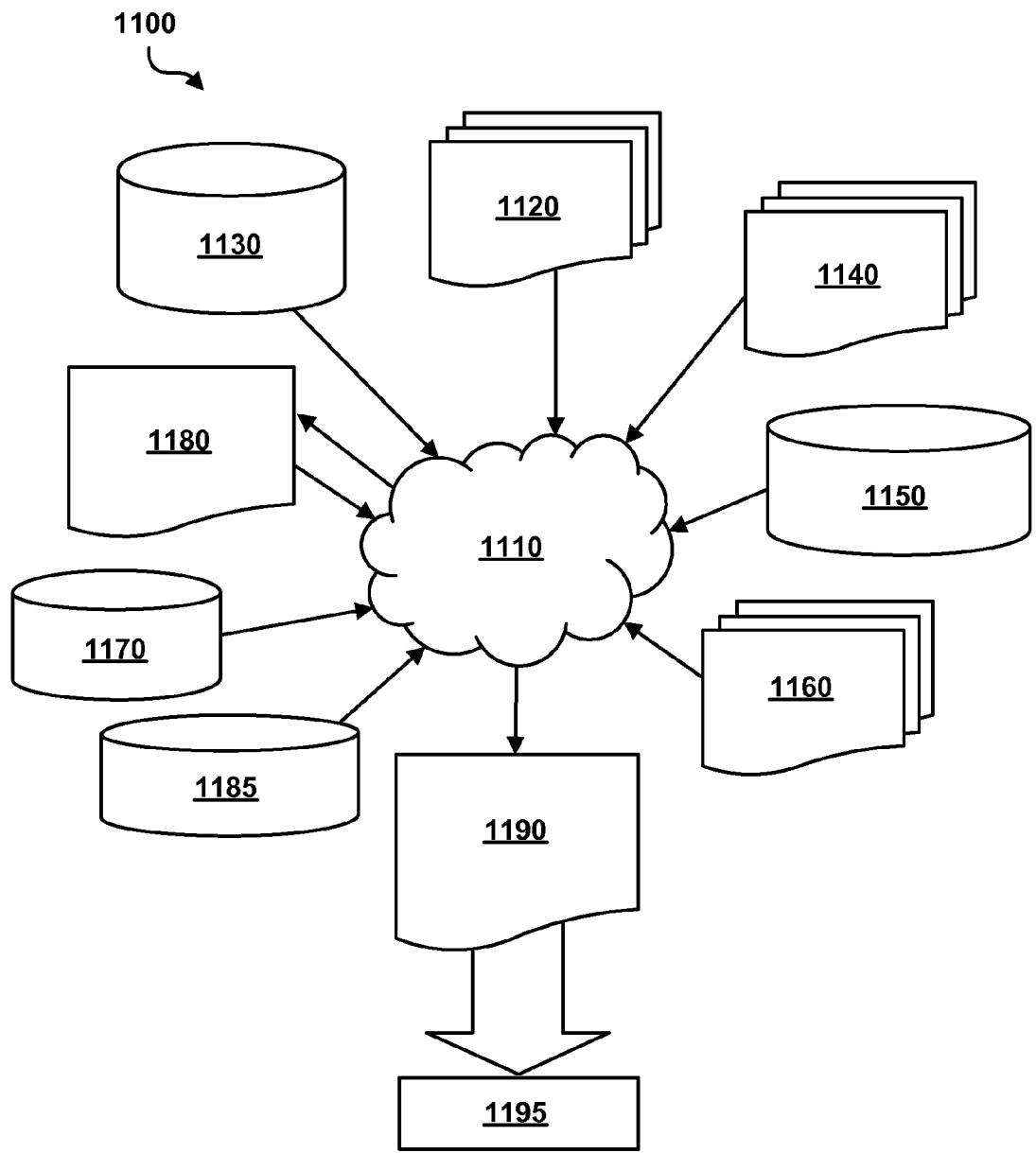
FIG. 11 is a block diagram of an exemplary design flow used, for example, in semiconductor design, manufacturing, and/or test, according to the preferred embodiment.

FIG. 11 shows a block diagram of an exemplary design flow 1100 used, for example, in semiconductor design, manufacturing, and/or test. Design flow 1100 may vary depending on the type of integrated circuit chip (IC) being designed. For example, a design flow 1100 for building an application specific IC (ASIC) may differ from a design flow 1100 for designing a standard component. Design structure 1120 is preferably an input to a design process 1110 and may come from an intellectual property provider, a core developer, or other design company or may be generated by the operator of the design flow, or from other sources. Design structure 1120 comprises an embodiment of the invention as shown in any of FIG. 9 or 10 in the form of schematics or a hardware-description language (HDL) (e.g., Verilog, VHDL, C, etc.). Design structure 1120 may be contained on one or more machine readable medium. For example, design structure 1120 may be a text file or a graphical representation of an embodiment of the invention as shown in any of FIG. 9 or 10. Design process 1110 preferably synthesizes (or translates) an embodiment of the invention as shown in any of FIG. 9 or 10 into a netlist 1180, where netlist 1180 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 1180 is resynthesized one or more times depending on design specifications and parameters for the circuit.

Design process 1110 may include using a variety of inputs; for example, inputs from library elements 1130 which may house a set of commonly used elements, circuits, and devices, including models, layouts, and symbolic representations, for a given manufacturing technology (e.g., different technology nodes, 32 nm, 45 nm, 90 nm, etc.), design specifications 1140, characterization data 1150, verification data 1160, design rules 1170, and test data files 1185 (which may include test patterns and other testing information). Design process 1110 may further include, for example, standard circuit design processes such as timing analysis, verification, design rule checking, place and route operations, etc. One of ordinary skill in the art of integrated circuit design can appreciate the extent of possible electronic design automation tools and applications used in design process 1110 without deviating from the scope and spirit of the invention. The design structure of the invention is not limited to any specific design flow.

Design process 1110 preferably translates an embodiment of the invention as shown in any of FIG. 9 or 10, along with any additional integrated circuit design or data (if applicable), into a second design structure 1190. Design structure 1190 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 1190 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in any of FIG. 9 or 10. Design structure 1190 may then proceed to a stage 1195 where, for example, design structure 1090: proceeds to tape-out, is released to manufacturing, is released to a mask house, is sent to another design house, is sent back to the customer, etc.

Although a specific embodiment of the invention has been disclosed along with certain alternatives, it will be recognized by those skilled in the art that additional variations in form and detail may be made within the scope of the following claims:

What is claimed is:

1. A memory apparatus for a computer system, comprising:
a memory module daisy chain containing a plurality of memory modules arranged sequentially;
a plurality of primary communications links, each primary communications link providing bi-directional communication between a respective pair of devices, wherein a first primary communications link is configured to provide communication between a memory accessing device and a first memory module in said memory module daisy chain, said first memory module being located at the first sequential position in said memory module daisy chain, and each subsequent primary communication link is configured to provide communication between a respective memory module in said memory module daisy chain and a next succeeding memory module in said memory module daisy chain;
a plurality of alternate communications links, each alternate communications link providing bi-directional communication between a respective pair of devices, wherein a first alternate communications link is configured to provide communication between a memory accessing device and a memory module in said memory module daisy chain other than said first memory module, and each subsequent alternate communications link is configured to provide communication between a respective memory module in said memory module daisy chain and a memory module in said memory module daisy chain other than the memory module next succeeding the respective memory module;
said plurality of primary and alternate communications links being configured to provide, in the event of failure of any single module of said memory module daisy chain, at least one respective path which does not traverse the failing module from a memory access device to each module of said memory module daisy chain other than the failing module.

2. The memory apparatus of claim 1, wherein each said memory access device is a memory controller.

3. The memory apparatus of claim 1, wherein each said memory access device is a hub configured in a hub daisy chain, said hub daisy chain comprising a plurality of hubs arranged sequentially and being driven by a memory controller, each hub supporting a respective at least one memory module daisy chain.

4. The memory apparatus of claim 3, wherein each said hub in said hub daisy chain supports a respective plurality of memory module daisy chains.

5. The memory apparatus of claim 3, wherein each said memory module is accessible via a respective primary path originating in a respective primary hub and via a respective alternate path originating in a respective alternate hub, said hubs being configured to provide, in the event of failure of any single hub of said memory apparatus, at least one respective alternate path which does not traverse the failing hub from a memory controller to each memory module of a memory module daisy chain which is supported by the failing hub.

6. The memory apparatus of claim 3, wherein said daisy chain of hubs comprises:
a plurality of primary hub communications links, each primary hub communications link providing bi-directional communication between a respective pair of devices, wherein a first primary hub communications link is configured to provide communication between said memory controller and a first hub in said hub daisy chain, and each subsequent primary hub communication link is configured to provide communication between a respective hub in said hub daisy chain and a next succeeding hub in said hub daisy chain;

a plurality of alternate hub communications links, each alternate hub communications link providing bi-directional communication between a respective pair of devices, wherein a first alternate hub communications link is configured to provide communication between said memory controller and a hub in said hub daisy chain other than said first hub, and each subsequent alternate hub communications link is configured to provide communication between a respective hub in said hub daisy chain and a hub in said hub daisy chain other than the hub next succeeding the respective hub;

said plurality of primary and alternate hub communications links being configured to provide, in the event of failure of any single hub of said hub daisy chain, at least one respective path which does not traverse the failing hub from said memory controller to each hub of said hub daisy chain of hubs other than the failing hub.

7. The memory apparatus of claim 1, wherein each of a plurality of said alternate communications links is configured to provide communication between a respective pair of memory modules consisting of a respective memory module located at the Nth sequential position in said chain of memory modules and a respective memory module located at the (N+2)th sequential position in said chain of memory modules.

8. The memory apparatus of claim 7, wherein said first alternate communications link is configured to provide communication between said memory accessing device and a second memory module, said second memory module being located at the second sequential position in said memory module daisy chain.

9. The memory apparatus of claim 7, wherein at least one said alternate communications link is configured to provide communication between a pair of memory modules consisting of: (a) one of a memory module located at the last sequential position in said chain of memory modules and a memory module located at the penultimate sequential position in said memory module daisy chain; and (b) one of said first memory module and a second memory module, said second memory module being located at the second sequential position in said memory module daisy chain; and wherein outbound communications are transmitted from the module (a) of the pair to the module (b) of the pair.

10. The memory apparatus of claim 1, wherein said memory apparatus comprises a plurality of said memory module daisy chains, and wherein at least some of said memory module daisy chains are cross-linked.

11. The memory apparatus of claim 1, wherein each said memory module comprises a respective first primary data interface for receiving outbound data access commands, a respective first alternate data interface for receiving outbound data access commands, a respective second primary data interface for re-transmitting said outbound data access commands to a memory module other than the respective memory module, and a respective second alternate data interface for re-transmitting said outbound data access commands to a memory module other than the respective memory module.

12. The memory apparatus of claim 11, wherein each said memory module further comprises control logic which, responsive to receiving each said outbound data access command having a respective data storage address associated with a memory module other than the respective memory module, selectively routes the command to one of said second primary data interface and said second alternate data interface for re-transmission to a memory module other than the respective memory module, said control logic being capable of selectively routing a data access command received in said first primary data interface to said second primary data interface and being capable of selectively routing a data access command received in said first primary data interface to said second alternate data interface, and said controller being capable of selectively routing a data access command received in said first alternate data interface to said second primary data interface and being capable of selectively routing a data access command received in said first alternate data interface to said second alternate data interface.

13. A computer system, comprising:

at least one processor;

a memory for storing data in addressable storage locations accessed by said at least one processor, said memory comprising at least one memory controller communicating with said at least one processor, and at least one memory module daisy chain containing a respective plurality of memory modules arranged sequentially, each said memory module daisy chain comprising:

a plurality of primary communications links, each primary communications link providing bi-directional communication between a respective pair of devices, wherein a first primary communications link is configured to provide communication between a memory accessing device and a first memory module in said memory module daisy chain, said first memory module being located at the first sequential position in said memory module daisy chain, and each subsequent primary communication link is configured to provide communication between a respective memory module in said memory module daisy chain and a next succeeding memory module in said memory module daisy chain;

a plurality of alternate communications links, each alternate communications link providing bi-directional communication between a respective pair of devices, wherein a first alternate communications link is configured to provide communication between a memory accessing device and a memory module in said memory module daisy chain other than said first memory module, and each subsequent alternate communications link is configured to provide communication between a respective memory module in said memory module daisy chain and a memory module in said memory module daisy chain other than the memory module next succeeding the respective memory module;

said plurality of primary and alternate communications links being configured to provide, in the event of failure of any single module of said memory module daisy chain, at least one respective path which does not traverse the failing module from a memory access device to each module of said memory module daisy chain other than the failing module.

14. The computer system of claim 13, wherein each said memory access device is a hub configured in a respective hub daisy chain, each said hub daisy chain comprising a plurality of hubs arranged sequentially and being driven by a respective said memory controller, each hub supporting a respective at least one memory module daisy chain.

15. A first data accessing module, comprising:

a first primary data interface for receiving outbound data access commands, each said outbound data access command having a respective data storage address, at least some said outbound data access commands having respective data storage addresses associated with said first data accessing module, and at least some said outbound data access commands having respective data storage addresses associated with a respective data accessing module other than said first data accessing module and of the same type as said first data accessing module;

a first alternate data interface for receiving outbound data access commands, each said outbound data access command having a respective data storage address, at least some said outbound data access commands having respective data storage addresses associated with said first data accessing module, and at least some said outbound data access commands having respective data storage addresses associated with a respective data accessing module other than said first data accessing module and of the same type as said first data accessing module;

a second primary data interface for re-transmitting said outbound data access commands having respective data storage addresses associated with a respective data accessing module other that said first data accessing module to a data accessing module other than said first data accessing module and of the same type as said first data accessing module;

a second alternate data interface for re-transmitting said outbound data access commands having respective data storage addresses associated with a respective data accessing module other that said first data accessing module to a data accessing module other than said first data accessing module and of the same type as said first data accessing module; and control logic which, responsive to receiving each said outbound data access command having a respective data storage address associated with a data accessing module other than said first data accessing module, selectively routes the command to one of said second primary data interface and said second alternate data interface for re-transmission to a data accessing module other than said first data accessing module, said control logic being capable of selectively routing a data access command received in said first primary data interface to said second primary data interface and being capable of selectively routing a data access command received in said first primary data interface to said second alternate data interface, and said controller being capable of selectively routing a data access command received in said first alternate data interface to said second primary data interface and being capable of selectively routing a data access command received in said first alternate data interface to said second alternate data interface.

16. The first data accessing module of claim 15, wherein said first data accessing module is a memory module containing a plurality of addressable storage locations for storing data, and wherein said control logic, responsive to receiving each said outbound data access command having a data storage address associated with said first data accessing module, causes the corresponding addressable storage location of said first data accessing module to be accessed.

17. The first data accessing module of claim 15, wherein said first data accessing module is a hub containing at least one memory module data interface for accessing a plurality of memory modules each containing a respective plurality of addressable storage locations for storing data, and wherein said control logic, responsive to receiving each said outbound data access command having a data storage address associated with said first data accessing module, re-transmits the outbound data access command to the memory module containing corresponding addressable storage location using a corresponding memory module data interface of said at least one memory module data interface.

18. The first data accessing module of claim 17, wherein said first data accessing module comprises a plurality of memory module interfaces for accessing a plurality of memory modules each containing a respective plurality of addressable storage locations for storing data, each of said memory modules being accessible via at least two respective memory module interfaces of said plurality of memory module interfaces, and wherein said control logic, responsive to receiving each said outbound data access command having a data storage address associated with said first data accessing module, selectively routes the command to one of said at least two respective memory module interface for re-transmission to the corresponding memory module, said control logic being capable of selectively routing a data access command received in any of said first primary data interface and said first alternate data interface to any of said at least two respective memory module interfaces.

19. The first data accessing module of claim 15, wherein said first data accessing module further comprises a routing register coupled to said control logic, said routing register specifying a respective one of said second primary data interface and said second alternate data interface as a routing corresponding to each said data storage address, said control logic selectively routing each said outbound data access command having a respective data storage address associated with a respective data accessing module other than said first data accessing module to one of said second primary data interface and said second alternate data interface for re-transmission to a data accessing module other than said first data accessing module according to the data interface specified by said routing register.

20. The first data accessing module of claim 15, wherein said control logic decodes at least one respective routing bit contained in each said outbound data access command to determine a selective routing of the data access command to one of said second primary data interface and said second alternate data interface for re-transmission to a data accessing module other than said first data accessing module.

* * * * *